(12) United States Patent
Tanaka et al.

(10) Patent No.: US 7,777,210 B2
(45) Date of Patent: Aug. 17, 2010

(54) LASER IRRADIATION METHOD IN WHICH A DISTANCE BETWEEN AN IRRADIATION OBJECT AND AN OPTICAL SYSTEM IS CONTROLLED BY AN AUTOFOCUSING MECHANISM AND METHOD FOR MANUFACTURING SEMICONDUCTOR DEVICE USING THE SAME

(75) Inventors: Koichiro Tanaka, Atsugi (JP); Yoshiaki Yamamoto, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/480,984

(22) Filed: Jun. 9, 2009

(65) Prior Publication Data

US 2009/0250590 A1 Oct. 8, 2009

Related U.S. Application Data

(63) Continuation of application No. 11/107,844, filed on Apr. 18, 2005, now Pat. No. 7,547,866.

(30) Foreign Application Priority Data

Apr. 28, 2004 (JP) .............................. 2004-134438

(51) Int. Cl.
*G01N 21/86* (2006.01)
(52) U.S. Cl. ................................. 250/559.3; 250/201.2
(58) Field of Classification Search ............. 250/559.3, 250/201.2, 201.3, 201.7, 548, 559.4; 356/399–401, 356/430, 431, 609, 630; 355/53–55
See application file for complete search history.

(56) References Cited

U.S. PATENT DOCUMENTS 3,689,159 A * 9/1972 Taniguchi et al. ........... 356/123

(Continued)

FOREIGN PATENT DOCUMENTS

CN 1159593 9/1997

(Continued)

OTHER PUBLICATIONS

Office Action (Application No. 200510081724.4) dated Nov. 16, 2007.

*Primary Examiner*—Que T Le
(74) *Attorney, Agent, or Firm*—Eric J. Robinson; Robinson Intellectual Property Law Office, P.C.

(57) ABSTRACT

The present invention is to provide a laser irradiation method for performing homogeneous laser irradiation to the irradiation object even when the thickness of the irradiation object is not even. In the case of irradiating the irradiation object having uneven thickness, the laser irradiation is performed while keeping the distance between the irradiation object and the lens for condensing the laser beam on the surface of the irradiation object constant by using an autofocusing mechanism. In particular, when the irradiation object is irradiated with the laser beam by moving the irradiation object relative to the laser beam in the first direction and the second direction of the beam spot formed on the irradiation surface, the distance between the irradiation object and the lens is controlled by the autofocusing mechanism before the irradiation object is moved in the first and second directions.

32 Claims, 17 Drawing Sheets

U.S. PATENT DOCUMENTS

| | | |
|---|---|---|
| 5,675,140 A | 10/1997 | Kim |
| 6,737,672 B2 | 5/2004 | Hara et al. |
| 7,115,890 B2 | 10/2006 | Amar et al. |
| 7,115,903 B2 | 10/2006 | Isobe et al. |
| 2007/0034877 A1 | 2/2007 | Isobe et al. |

FOREIGN PATENT DOCUMENTS

| | | |
|---|---|---|
| CN | 1264824 | 8/2000 |
| CN | 1428873 | 7/2003 |
| EP | 1 326 273 | 7/2003 |
| JP | 2004-031810 | 1/2004 |

\* cited by examiner

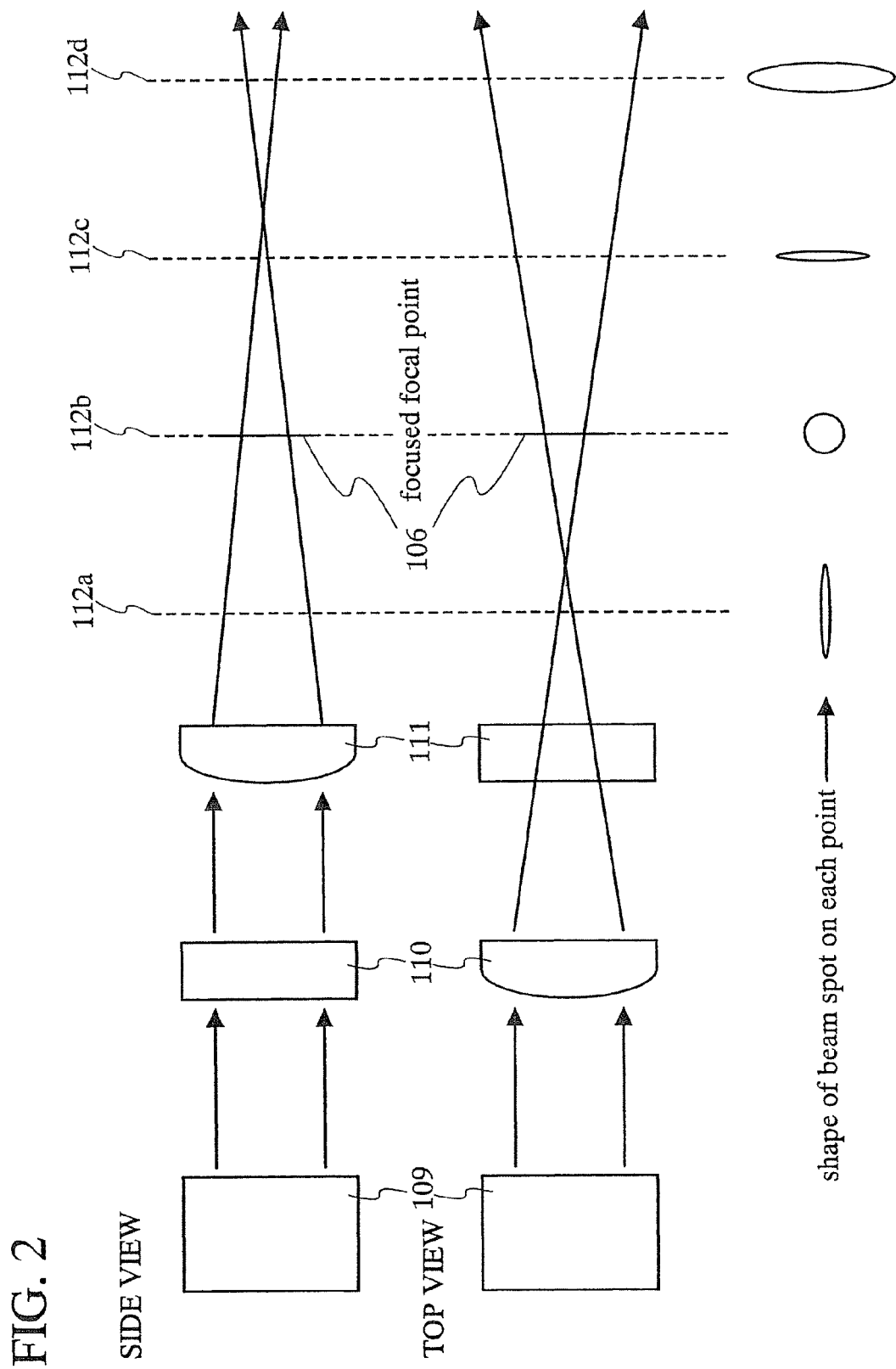

LASER IRRADIATION METHOD IN WHICH A DISTANCE BETWEEN AN IRRADIATION OBJECT AND AN OPTICAL SYSTEM IS CONTROLLED BY AN AUTOFOCUSING MECHANISM AND METHOD FOR MANUFACTURING SEMICONDUCTOR DEVICE USING THE SAME

BACKGROUND OF THE INVENTION

1. Field of the Invention

The present invention relates to a laser irradiation method and more particularly to a laser irradiation method for controlling laser irradiation to an irradiation object by an autofocusing mechanism. Moreover, the present invention relates to a method for manufacturing a semiconductor device with the use of the laser irradiation method.

2. Related Art

In recent years, a technique to manufacture a thin film transistor (TFT) over a substrate has made a great progress, and application development to an active matrix display device has been advanced. In particular, a TFT formed using a poly-crystalline semiconductor film is superior in field-effect mobility to a TFT formed using a conventional amorphous crystal semiconductor film, and therefore high-speed operation is possible when the TFT is formed using the poly-crystalline semiconductor film. For this reason, it has been tried to control a pixel by a driver circuit formed over the same substrate as the pixel, which has been conventionally controlled by a driver circuit provided outside the substrate.

A substrate used in a semiconductor device is expected to be a glass substrate in terms of cost. However, the glass substrate is inferior in heat resistance and easy to change in shape due to the heat. Therefore, when the TFT using the poly-crystalline semiconductor film is formed over the glass substrate, laser annealing is employed to crystallize a semiconductor film formed over the glass substrate in order to prevent the glass substrate from changing in shape due to the heat.

Compared with another annealing method which uses radiant heat or conductive heat, the laser annealing has advantages that the processing time can be shortened drastically and that a semiconductor substrate or a semiconductor film over a substrate can be heated selectively and locally so that the substrate is hardly damaged thermally.

In general terms, the laser annealing to the semiconductor film is often performed by using an excimer laser. The excimer laser has advantages of its high output power and high repetition rate. Moreover, the laser beam emitted from the excimer laser has an advantage that it is sufficiently absorbed in a silicon film, which is often employed as the semiconductor film. In the laser irradiating step, a beam spot of the laser beam on the irradiation object is shaped into a linear spot (including rectangular and elliptical spots) by an optical system, and the beam spot is moved relative to the irradiation object in a short-side direction of the linear beam spot. By such laser irradiation, the laser annealing can be performed to the irradiation object effectively.

Moreover, a continuous wave laser (also referred to as a CW laser) can be used in the laser annealing step. When a laser beam emitted from the CW laser is shaped into a linear spot and the semiconductor film, which is the irradiation object, is moved relatively in the short-side direction of the beam spot on the irradiation object, a large crystal grain extending long in the moving direction can be formed in the semiconductor film. A TFT manufactured in accordance with the extending direction of the large crystal grain can have higher carrier-mobility than a TFT manufactured using the excimer laser. With the TFT having high carrier-mobility, the circuit can be driven at higher speed, and therefore a driver, a CPU, and the like can be manufactured.

The laser beam emitted from the CW laser to be generally used in the laser annealing has a wavelength of 532 nm because this wavelength is sufficiently absorbed in amorphous silicon (a-Si) and the conversion efficiency from the fundamental wave by the non-linear optical element is high. Usually, the shorter the wavelength of the laser beam is, the more a-Si absorbs the laser beam. Meanwhile, the shorter the wavelength is, the lower the power of the laser beam is.

A technique for forming the TFT with the use of the semiconductor film crystallized by the above method has been carried out in many fields.

When the power of the laser beam is low, the laser beam is condensed on one point in the irradiation object by a lens in order to increase the energy density or the power density of the laser beam. Moreover, even in the case of forming a pattern on the irradiation object directly by irradiating the irradiation object with the laser beam, the beam spot is condensed on the irradiation object by the lens. For example, when the semiconductor film is crystallized using the CW laser, the beam spot is shaped into an elongate spot such as a rectangular, elliptical, or linear spot on the irradiation object and condensed to have a length of several μm in the short-side direction by the lens in order to increase the throughput as much as possible. Furthermore, when a fine pattern is imaged directly to the irradiation object by the laser irradiation, the beam spot is narrowed further.

To narrow the diameter of the beam spot formed over the irradiation object by condensing the laser beam, it is necessary to use a lens having large numeral aperture (NA). Generally, NA and a focal depth Z satisfy the equation $Z=\pm\lambda/2NA^2$ where λ is the wavelength of the laser beam. Therefore, when the lens has larger NA, the focal depth of the lens becomes shorter accordingly. For example, when using the CW laser, the focal depth needs to be adjusted to be approximately several μm.

However, when a substrate typified by a glass substrate becomes larger, the variation of the thickness of the substrate becomes more remarkable. The thickness may vary within the substrate by several tens μm. For example, when the semiconductor film formed over the glass substrate or the like whose thickness is not even is annealed by the laser irradiation, the distance between the lens and the irradiation object depends on the location in the substrate, and the beam spot shape changes depending on the location accordingly. For this reason, the crystallinity differs depending on the location even in the semiconductor film formed over the same substrate.

SUMMARY OF THE INVENTION

In view of the above problem, it is an object of the present invention to provide a laser irradiation method for irradiating an irradiation object with the laser beam homogeneously even when the thickness of the irradiation object is not even. It is another object of the present invention to provide a method for manufacturing a semiconductor device with the use of the laser irradiation method.

The present invention discloses a laser irradiation method in which the laser irradiation is performed while keeping the distance between the irradiation object and the lens for focusing the laser beam on the irradiation object constant by using the autofocusing mechanism. Particularly, in the case of performing the laser irradiation by moving the irradiation object relative to the laser beam incident thereinto in a first direction and a second direction of the beam spot formed over the irradiation object, the distance between the lens and the irradiation object is controlled by the autofocusing mechanism before the irradiation object moves in the first and second directions. It is to be noted that the autofocusing mechanism is for adjusting the focal point of the laser beam delivered to the irradiation object through the lens on the irradiation object.

In the case of performing the laser irradiation to the irradiation object including a swell, the autofocusing is conducted in advance in consideration of the swell. For example, when the swell exists along the first direction of the irradiation object and the laser irradiation is performed in the first direction and the second direction perpendicular to the first direction, the autofocusing may be conducted before moving the irradiation object in the second direction where the swell does not exist.

Specifically, the autofocusing mechanism corrects the change of the distance between the lens and the irradiation object due to the swell of the substrate after moving the irradiation object relative to the laser beam incident into the irradiation object in the first direction where the swell exists. The autofocusing mechanism may control the distance between the lens and the irradiation object while moving the irradiation object in the first direction where the swell exists.

The beam spot formed on the irradiation object can be shaped into a rectangular spot or an elongate spot such as an elliptical or linear spot having a short side and a long side by the optical system. The laser irradiation can be performed effectively when the elongate beam spot is formed so that the long side of the beam spot is parallel to the first direction where the swell exists. The optical system herein described is a combination of one or a plurality of lenses and mirrors for condensing the laser beam on any portion.

The laser irradiation may be performed to the irradiation object by moving one or both of the irradiation object and the laser beam. It is preferable to move one or both of the irradiation object and the laser beam more slowly in the first direction where the swell exists than in the second direction because the irradiation position can be controlled with high accuracy and the homogeneous irradiation becomes possible.

To conduct autofocusing, any method may be employed when the laser beam can be focused on the surface of the irradiation object. For example, a laser beam and a detector for detecting the laser beam (four-array photodetectors, a CCD (Charge Coupled Device), a PSD (Position Sensitive Detector), or the like) may be used. The laser beam can be constantly focused on the irradiation object by measuring the distance between the lens and the irradiation object with these laser beam and detector and keeping the distance therebetween constant. The distance between the lens and the irradiation object can be controlled by providing a micro-motion device to the lens or the stage. Moreover, the laser beam for measuring the distance between the lens and the irradiation object may be provided separately from the laser beam for annealing the irradiation object, or may be also used as the laser beam for annealing the irradiation object. As another autofocusing method, a method used for playing a CD, a DVD, or the like (for example, an astigmatic method, a knife edge method, a Foucault method, or a critical angle method) can be used. Moreover, it is possible to control the distance between the lens and the irradiation object by directly contacting a contact displacement sensor to the irradiation object. The distance between the lens and the irradiation object may be controlled by the autofocusing mechanism while moving the optical system including the lens or moving the irradiation object.

When the annealing is performed by irradiating the semiconductor film with the laser beam according to the above-mentioned laser irradiation method, the semiconductor film can be crystallized or activated, for example. Moreover, the annealed semiconductor film can be used to manufacture a semiconductor device.

The laser oscillator used in the present invention is not limited in particular, and the pulsed laser oscillator or the continuous wave (CW) laser oscillator may be used. The pulsed laser is, for example, an excimer laser, a YAG laser, or a $YVO_4$ laser. The CW laser is, for example, a YAG laser, a $YVO_4$ laser, a $GdVO_4$ laser, a YLF laser, or an Ar laser. By using the CW laser beam, it is possible to form a large crystal grain extending long in the scanning direction of the laser beam. Furthermore, a pulsed laser oscillator with a repetition rate of 10 MHz can be used. The large crystal grain extending long in the scanning direction can be obtained even by using a laser beam emitted from a pulsed laser oscillator with the repetition rate of 10 MHz or more (this laser beam is also referred to as a quasi-CW laser beam).

According to the present invention, the laser irradiation can be performed homogeneously even when the thickness in the irradiation object is not even. Moreover, the laser irradiation can be performed effectively by performing the laser irradiation in consideration of the swell of the irradiation object.

BRIEF DESCRIPTION OF THE DRAWINGS

In the accompanying drawings:

FIG. 2 is a drawing showing the relation between an optical path length and the shape of a beam spot in an optical system;

DETAILED DESCRIPTION OF THE INVENTION

Embodiment Mode

Figure 1:
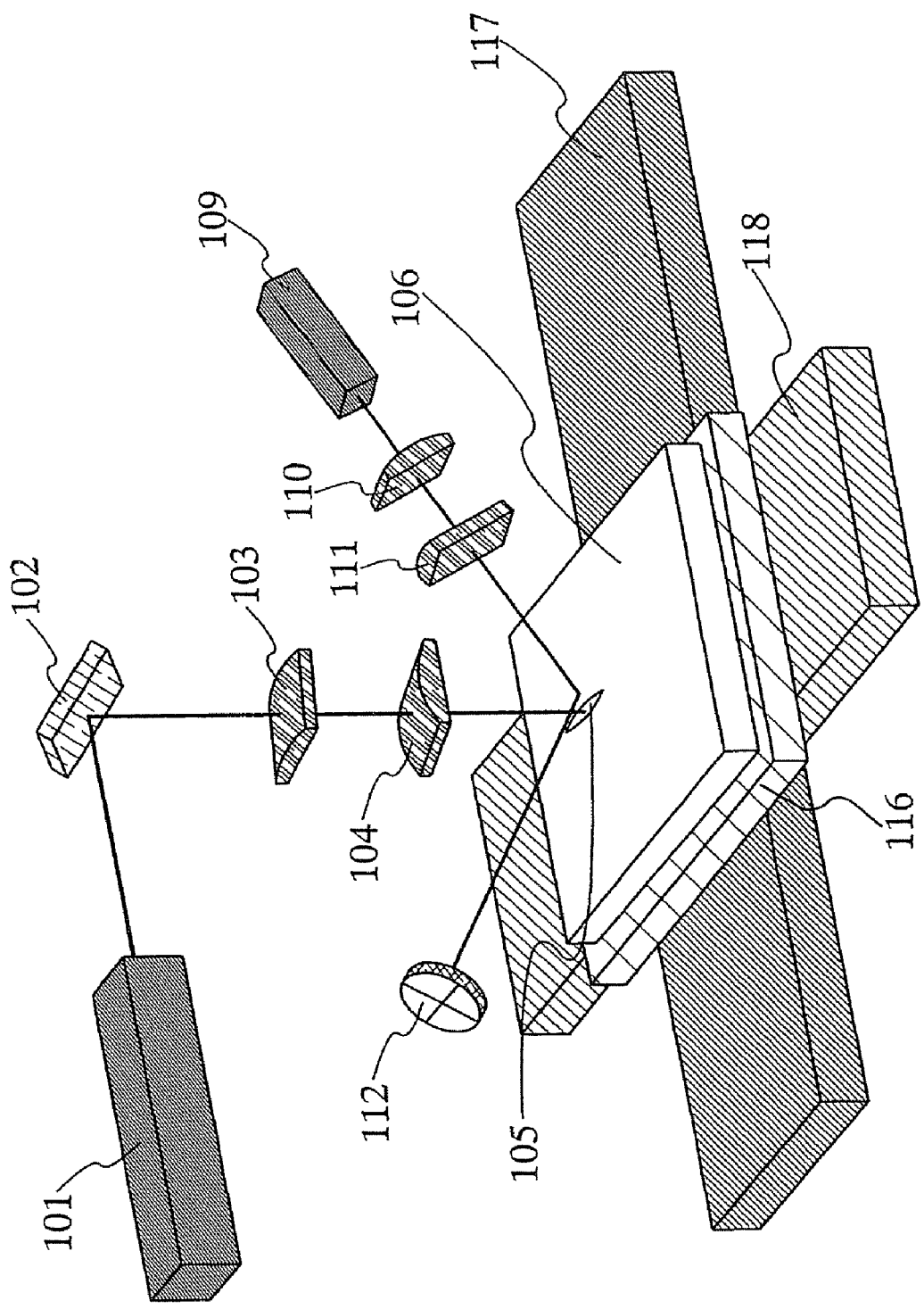
FIG. 1 is a drawing showing a laser irradiation method of the present invention.

Embodiment modes of the present invention are hereinafter described with reference to the drawings. However, since the present invention can be embodied in many different modes, it is easily understood by those who are skilled in the art that the mode and the detail of the present invention can be changed and modified within the content and the scope of the present invention. Therefore, the present invention is not limited to the description of the embodiment modes. Moreover, the same reference numeral is given to the same part through the drawings.

In the present invention, the laser irradiation is performed to the irradiation object while keeping the distance between the lens and the irradiation object constant by the autofocusing mechanism. The autofocusing mechanism comprises a detector for detecting whether the focal point of the laser beam that is irradiated to the irradiation object through the lens is on the surface of the irradiation object, and a controller for controlling the distance between the lens and the irradiation object. To control the distance between the lens and the irradiation object, two methods are given, in one of which the irradiation object is moved and in the other of which the optical system including the lens is moved.

Moreover, when the irradiation object has regular swell, the laser irradiation is performed in consideration of the swell. For example, a glass substrate usually has a swell in a certain direction due to its manufacturing process. Therefore, in the case of using a glass substrate, the autofocusing mechanism is used to adjust the focal point on the irradiation object only when the substrate is moved in the direction where the swell exists, while the autofocusing mechanism may not be used when the substrate is moved in the direction where the swell does not exist.

For example, the irradiation object can be irradiated with the laser beam in the present invention as follows: the semiconductor film is annealed with the laser beam; a semiconductor film is activated by irradiating the semiconductor film with the laser beam; the irradiation object is microprocessed by the photolithography technique; or a pattern is formed by direct laser irradiation. Moreover, the present invention is not limited to these examples, and includes any kinds of steps in which the irradiation object is processed by laser irradiation.

The laser oscillator used in the laser irradiation is not limited in particular, and the pulsed laser oscillator or the CW laser oscillator may be used. Moreover, the pulsed laser oscillator with a repetition rate of 10 MHz or more can be used.

Embodiment Mode 1

With reference to FIG. 1, this embodiment mode 1 describes a configuration for controlling the distance between a lens and an irradiation object by moving the irradiation object according to the laser irradiation method using an autofocusing mechanism.

In FIG. 1, a first laser beam is emitted from a laser oscillator 101 having a repetition rate of 10 MHz or more, and is reflected on a mirror 102 so as to be incident vertically into an irradiation object 106. After that, the first laser beam is incident into cylindrical lenses 103 and 104 which respectively act on different directions, and then condensed on the irradiation object 106. Thus, a linear beam spot 105 is formed on the irradiation object 106.

Although the laser oscillator 101 is a laser oscillator with a repetition rate of 10 MHz or more, the present invention is not limited to this, and a CW laser oscillator may be used. In the case of using the CW laser oscillator, the first laser beam is made incident obliquely at a certain angle or more, not vertically, into the irradiation object to avoid the interference between the reflected beam and the incident beam on the irradiation object. In this case, the incidence angle $\Theta$ of the laser beam may satisfy the inequality of $\Theta = \tan^{-1}(l/2d)$ where l is the length of the beam spot in the incident direction of the laser beam and d is the thickness of the irradiation object.

The irradiation object 106 can be moved by a Z-axis stage 116, an X-axis stage 117, and a Y-axis stage 118. The Z-axis stage 116 can adjust the tilt of the irradiation object 106 and move the irradiation object 106 upward or downward. In this embodiment mode, the first laser beam is delivered to the irradiation object 106 by moving the X-axis stage 117 and the Y-axis stage 118.

To keep the distance between the irradiation object 106 and each of the cylindrical lenses 103 and 104 constant, an autofocusing mechanism including a laser oscillator 109, cylindrical lenses 110 and 111, four-array photodetectors 112, and the Z-axis stage 116 is used. To keep the distance between the irradiation object 106 and each of the cylindrical lenses 103 and 104 constant means to keep the focal point of the cylindrical lenses 103 and 104 on the irradiation object 106. It is to be noted that the distance between the cylindrical lenses 103 and 104 is fixed. When the focal point of the cylindrical lens 104 is on the surface of the irradiation object 106, the focal point of the cylindrical lens 103 is also on the surface of the irradiation object 106.

A second laser beam emitted from the laser oscillator 109 is incident into the irradiation object 106 through the two cylindrical lenses 110 and 111, and the laser beam reflected on the irradiation object 106 is detected with the four-array photodetectors 112. Here, the optical path length of the second laser beam changes when the surface of the irradiation object 106 gets higher or lower. The four-array photodetectors 112 convert the detected beam into an electric signal in proportion to the intensity of the beam. Based on this electric signal, the Z-axis stage 116 working with the four-array photodetectors 112 is moved so as to keep the distance between the cylindrical lens 104 and the irradiation object 106 constant. It is preferable to make the second laser beam incident obliquely into the surface of the irradiation object 106 as shown in FIG. 1. In this case, since the first laser beam is made incident vertically into the irradiation object 106 and the second laser beam is made incident obliquely into the irradiation object 106, it is possible to provide the optical systems for emitting the first laser beam and the second laser beam in different positions, and this configuration facilitates the construction of the optical system.

With reference to FIG. 2, a relation between the beam shape and the optical path length in the optical system including two cylindrical lenses is described.

At the position of a plane 112b in FIG. 2, the first laser beam shown in FIG. 1 is focused on the irradiation object 106. Here, the focal points of the two cylindrical lenses 110 and 111 are adjusted so that the beam spot becomes circular on the irradiation object 106.

When the irradiation object 106 comes closer to the cylindrical lens 104, the beam spot becomes elliptical, as shown at the plane 112a, because the optical path length becomes shorter. On the other hand, when the irradiation object 106 goes farther from the cylindrical lens 104, as shown at the plane 112c, the beam spot becomes elliptical in a direction perpendicular to the ellipse formed at the plane 112a because the optical path length becomes longer. Moreover, when the irradiation object 106 goes much farther, as shown at the plane 112d, the intensity of the laser beam becomes lower, and the value detected by the four-array photodetectors becomes lower.

In the case of providing the irradiation object 106 in a tilted state, the reflected laser beam does not reach the four-array photodetectors 112, and therefore the current value is not detected. Even if the reflected beam reaches the four-array photodetector 112, the different current values are detected by the respective four photodetectors.

Next, the relation between the four-array photodetectors and the beam spot is described with reference to FIGS. 3A to 3E.

In FIGS. 3A to 3E, each of the four-array photodetectors is denoted with reference characters (a) to (d). When the beam is delivered to each photodetector, the beam is converted into electricity in proportion to the intensity of the beam.

Figure 3A:
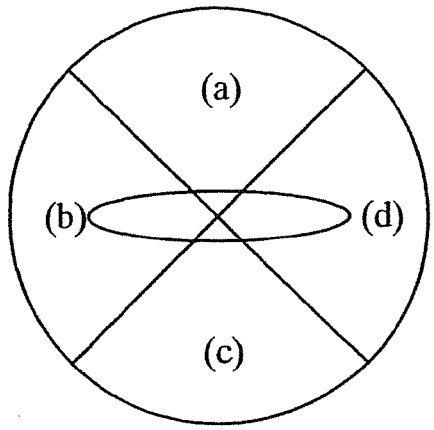
FIGS. 3A to 3E are drawings showing the relation between four-array photodetectors and a beam spot.

When the optical path length is short as shown in FIG. 3A, which means when the distance between the cylindrical lens 104 and the irradiation object 106 is shorter than the focal length of the cylindrical lens 104, the beam spot formed at the four-array photodetectors is elliptical. The current value detected thereby is (a)=(c)<(b)=(d). To provide the irradiation object 106 at the focal point of the cylindrical lens 104, the Z-axis stage 116 may be moved in a direction apart from the cylindrical lens 104.

Figure 3B:
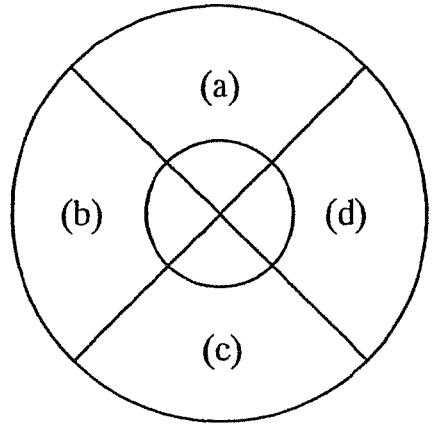

When the optical path length is appropriate as shown in FIG. 3B, which means when the distance between the cylindrical lens 104 and the irradiation object 106 is the same as the focal length of the cylindrical lens 104, the beam spot at the four-array photodetectors is circular. The current value detected thereby is (a)=(b)=(c)=(d).

Figure 3C:
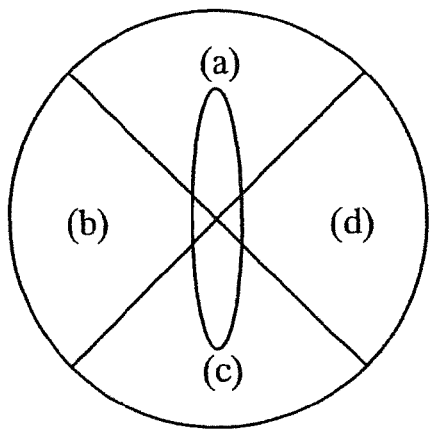

When the optical path length is long as shown in FIG. 3C, which means when the distance between the cylindrical lens 104 and the irradiation object 106 is longer than the focal length of the cylindrical lens 104, the beam spot at the four-array photodetectors is elliptical. The current value detected thereby is (a)=(c)>(b)=(d). To provide the irradiation object 106 at the focal point of the cylindrical lens 104, the Z-axis stage 116 may be moved in a direction toward the cylindrical lens 104.

Figure 3D:
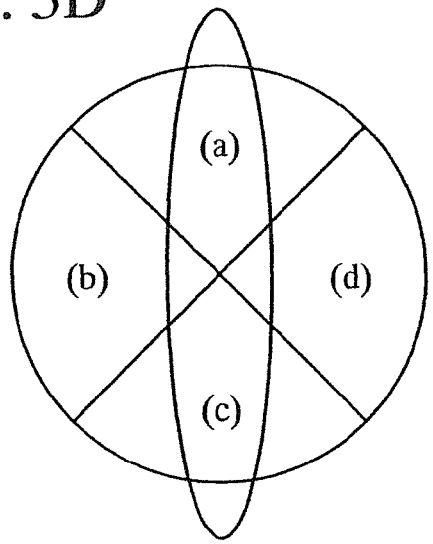

When the optical path length is extremely long as shown in FIG. 3D, which means when the distance between the cylindrical lens 104 and the irradiation object 106 is much longer than the focal length of the cylindrical lens 104, the beam spot at the four-array photodetectors is elliptical, and a part of the beam spot is not incident into the four-array photodetectors. Here, the total current value metered by the respective photodetectors is low because of the part of the beam spot not incident into the photodetectors. In this case, as is in FIG. 3C, the Z-axis stage 116 may be moved in a direction toward the cylindrical lens 104.

Figure 3E:
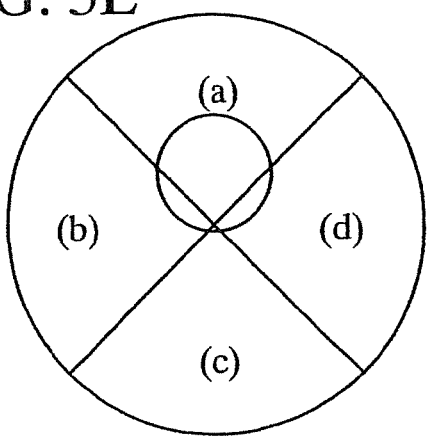

When the optical path length is appropriate and the irradiation object 106 is tilted as shown in FIG. 3E, which means when the plane portion of the cylindrical lens 104 is not parallel to the surface of the irradiation object 106, the beam spot at the four-array photodetectors is circular. In this case, the current value metered by the four-array photodetectors is (a)>(b)=(d)>(c). In the photodetectors, only (b) and (d) have the same current value, while (a) and (c) do not. In this case, the Z-axis stage 116 may be adjusted so as to tilt toward the four-array photodetectors.

As thus described, the Z-axis stage 116 may be controlled so that the intensity of the laser beam delivered to the four-array photodetectors is constant at all of the four photodetectors.

The irradiation object 106 may be formed of any kind of materials which can be processed by the laser irradiation. Specifically, the irradiation object 106 may be, for example, a semiconductor; a semiconductor film formed over a substrate of glass, plastic, or the like; metal; an organic resin film; or the like. When the irradiation object 106 is the semiconductor film formed over the glass substrate, the semiconductor film can be annealed by irradiating the semiconductor film with the laser beam. Even when the thickness of the semiconductor film is not even due to the unevenness of the glass substrate, the semiconductor film can be annealed homogeneously because the laser irradiation can be performed with the autofocusing mechanism. Moreover, when the irradiation object 106 is the organic resin film, the organic resin film can be patterned or have an opening therein by the laser irradiation. By performing the laser irradiation with the autofocusing mechanism in such a way that the laser beam is focused correctly on the surface of the organic resin film, a pattern and an opening can be formed correctly.

Although the present embodiment mode has described the example of using the four-array photodetectors to detect the second laser beam, the present invention is not limited to this, and a CCD, a PSD, or the like can be used to detect the second laser beam. Furthermore, instead of the second laser beam, it is possible to use a contact displacement sensor which directly contacts the irradiation object 106, an electrostatic capacity displacement sensor which uses the change of the electrostatic capacity, an eddy current displacement sensor which uses high-frequency magnetic field as the autofocusing mechanism.

Although the first laser beam emitted from the laser oscillator 101 with the repetition rate of 10 MHz or more is incident vertically into the irradiation object 106 in this embodiment mode, the laser beam may be made incident obliquely in the same manner as when using the CW laser. In this case, it is preferable to make the second laser beam emitted from the laser oscillator 109 incident vertically. By making the second laser beam incident vertically when the first laser beam is made incident obliquely, the optical systems for shaping the first and second laser beams do not overlap each other; therefore, the optical systems can be easily assembled. Moreover, when the second laser beam is made incident vertically, the second laser beam can be easily delivered to the vicinity of the beam spot of the first laser beam formed on the irradiation object 106, and accordingly, the accuracy of autofocusing can be improved.

By providing the autofocusing mechanism in the above laser irradiation, it is possible to perform laser irradiation while controlling the distance between the lens and the irradiation object.

Embodiment Mode 2

It is preferable to perform autofocusing all the time in order to have the focal point of the laser beam condensed by the lens on the irradiation object. However, when the swell or the like on the irradiation object is known in advance, the autofocusing may be performed only as necessary to increase the processing efficiency. This embodiment mode describes a laser irradiation method when the glass substrate has the swell along a certain direction with reference to FIG. 8.

Generally, a larger glass substrate has a swell more easily, which are unique to the manufacturing process of the glass substrate. The swell changes based on the function having one or less inflection points in the glass substrate and exists along a certain direction. Meanwhile, the swell does not exist in the direction perpendicular to the direction where the swell exists. For this reason, the laser irradiation is preferably performed in consideration of the unique characteristic of a glass substrate.

Figure 8:
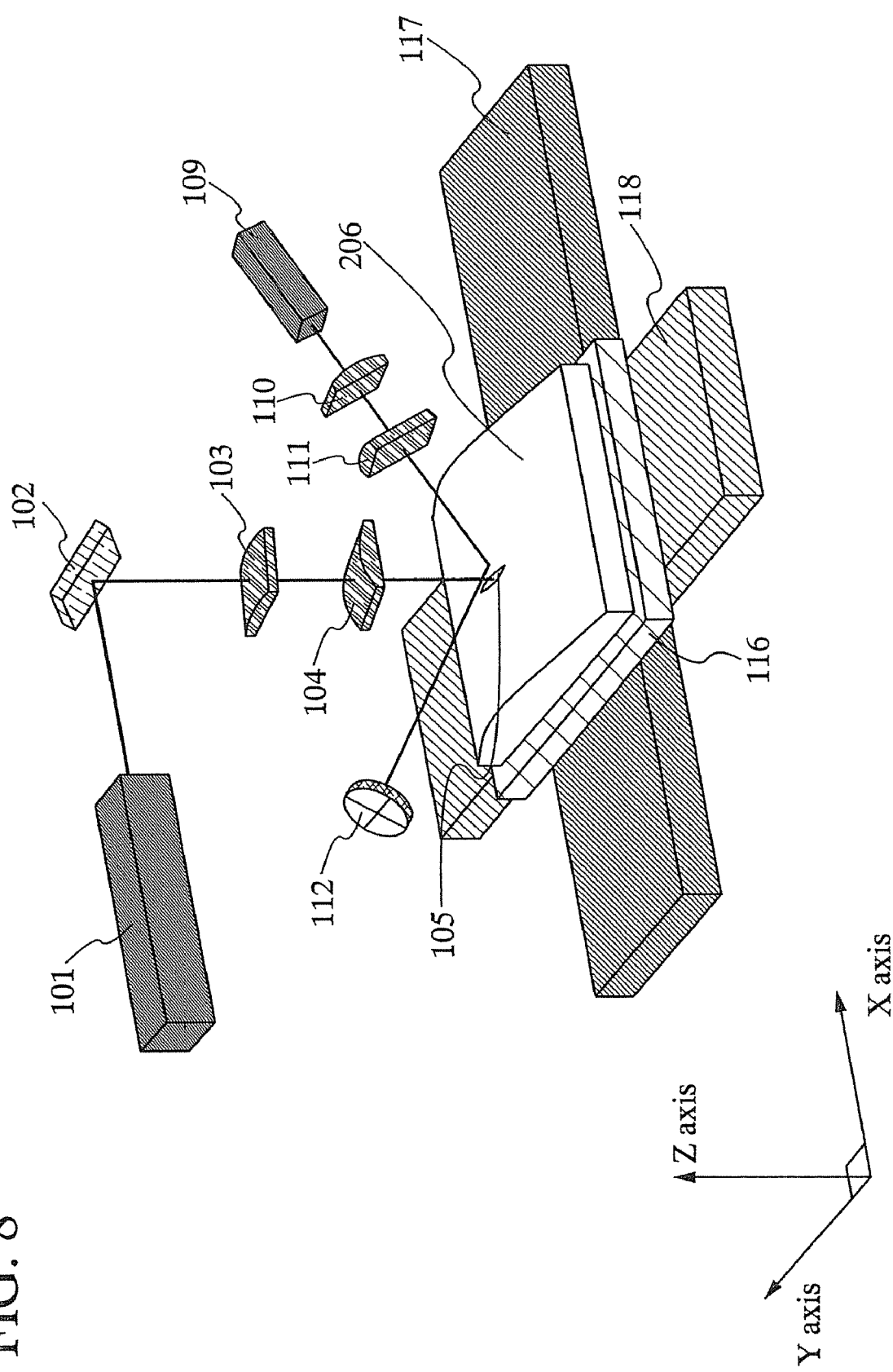
FIG. 8 is a drawing showing a laser irradiation method of the present invention.

In FIG. 8, since a semiconductor film 206 is formed over a glass substrate having a swell in one direction, the surface of the semiconductor film 206 swells in reflection of the swell of the glass substrate. In the same manner as FIG. 1, the first laser beam is emitted from the laser oscillator 101 (a CW laser or a pulsed laser with the repetition rate of 10 MHz or more) and reflected on a mirror 102. Then, the laser beam is incident vertically into the semiconductor film 206. After that, the first laser beam is incident into cylindrical lenses 103 and 104, and focused on the semiconductor film 206 formed over the glass substrate. Thus, the first laser beam is shaped into a linear beam spot 105 on the semiconductor film 206. When a CW laser oscillator is used as described above, the first laser beam may be made incident into the semiconductor film 206 at a certain angle, but not vertically.

In a three-dimensional configuration including an X-axis, a Y-axis, and a Z-axis, the glass substrate is provided in an X-Y axes plane. The X-axis direction is a direction where the glass substrate does not have the swell, the Y-axis direction is a direction perpendicular to the X-axis direction, and the Z-axis direction is a direction perpendicular to the X-axis and Y-axis directions. In this case, the glass substrate has the change to the Z-axis direction only in the Y-axis direction, but not in the X-axis direction. In other words, the glass substrate has the swell only in the Y-axis direction. Here, the linear beam is formed so that its short-side direction is parallel to the direction where the glass substrate does not have the swell (X-axis direction). The movement of the glass substrate is controlled by an X-axis stage 117, a Y-axis stage 118, and a Z-axis stage 116. The X-axis stage 117 moves the glass substrate in the X-axis direction, and the Y-axis stage 118 moves it in the Y-axis direction. The Z-axis stage 116 adjusts the tilt of the glass substrate and moves it in the Z-axis direction.

In the embodiment mode 2, the laser irradiation is performed while moving the semiconductor film 206, which is the irradiation object, in the X-axis and Y-axis directions. The annealing is performed in such a way that the semiconductor film 206 is irradiated with the first laser beam when the semiconductor film 206 moves in the short-side direction (X-axis direction) of the linear beam spot.

After moving the semiconductor film 206 in the X-axis direction to deliver the first laser beam from one end to the other end of the substrate, the semiconductor film 206 is moved in the Y-axis direction. The semiconductor film 206 is moved in the Y-axis direction to determine where to anneal in the X-axis direction next. For example, when the whole surface of the substrate is annealed, the semiconductor film 206 is moved in the Y-axis direction by the length of the linear beam spot in the long-side direction, and then the laser irradiation is performed.

Although the laser irradiation is performed by moving the semiconductor film 206 by the X-axis stage 117 and the Y-axis stage 118 while fixing the first laser beam in this embodiment mode, the laser irradiation may be performed by moving the laser beam while fixing the semiconductor film 206. Alternatively, both of the semiconductor film 206 and the laser beam may be moved to perform the laser irradiation.

Since the variation of thickness of the substrate in the X-axis direction is small, the distance between the cylindrical lens 104 and the semiconductor film 206 hardly changes even when the laser irradiation is performed by moving the semiconductor film 206 in the X-axis direction. On the other hand, since the glass substrate has the swell unique to the glass substrate in the Y-axis direction, the distance between the cylindrical lens 104 and the semiconductor film 206 changes with the movement of the semiconductor film 206 in the Y-axis direction.

When the swell exists in a certain direction, the autofocusing does not need to be performed all the time during the laser irradiation. The focal point of the laser beam may be adjusted once before the semiconductor film 206 moves in the X-axis direction. In the X-axis direction, the focal point is always on the semiconductor film by adjusting the focal point once as above; therefore, the homogeneous laser irradiation can be performed.

In other words, the focal point of the laser beam may be adjusted to be on the semiconductor film 206 after annealing the semiconductor film 206 from one end to the other end in the X-axis direction and before moving the semiconductor film 206 in the Y-axis direction and again in the X-axis direction. Moreover, when the glass substrate has a wide swell or a complex swell, the semiconductor film 206 may be moved in the Y-axis direction while controlling the distance between the cylindrical lens 103 and the semiconductor film 206 by the autofocusing mechanism as needed.

The semiconductor film 206 is moved at the speed appropriate for the crystallization in the X-axis direction where the annealing is performed. Specifically, the semiconductor film 206 is moved in the X-axis direction at the speed from 100 mm/s to 20 m/s, preferably from 10 to 100 cm/s. Within this range of speed, the large crystal grain can be obtained by the annealing. When the speed is 20 m/s or more, the crystal does not grow in the scanning direction of the laser beam. Meanwhile, the semiconductor film 206 is moved much slowly in the Y-axis direction where the annealed position is adjusted than in the X-axis direction. Specifically, the speed is preferably 100 mm/s or less to control the annealed position accurately.

The same autofocusing mechanism as that shown in the embodiment mode 1 can be used. The second laser beam emitted from the laser oscillator 109 is incident into the semiconductor film 206 through two cylindrical lenses 110 and 111, and the laser beam reflected on the semiconductor film 206 is detected by the four-array photodetectors 112. The Z-axis stage 116 is adjusted based on the condition detected by the four-array photodetectors 112 so that the distance between the cylindrical lens 104 and the semiconductor film 206 is kept constant.

Although this embodiment mode has described the example of the laser irradiation to the semiconductor film formed over the glass substrate having the wide swell in one direction, the present invention is not limited to this. The laser irradiation in consideration of the swell as described above can be performed to any kinds of irradiation objects such as a semiconductor, metal, an organic resin film, glass, and plastic which have the swell.

As shown in the embodiment mode 2, when the laser irradiation is performed in consideration of the swell of the irradiation object, the autofocusing is not necessary all the time. This can increase the processing efficiency.

Embodiment Mode 3

This embodiment mode describes a laser irradiation method in which the distance between a lens and an irradiation object is adjusted by moving an optical system including the lens with reference to FIGS. 4 to 7C.

Figure 4:
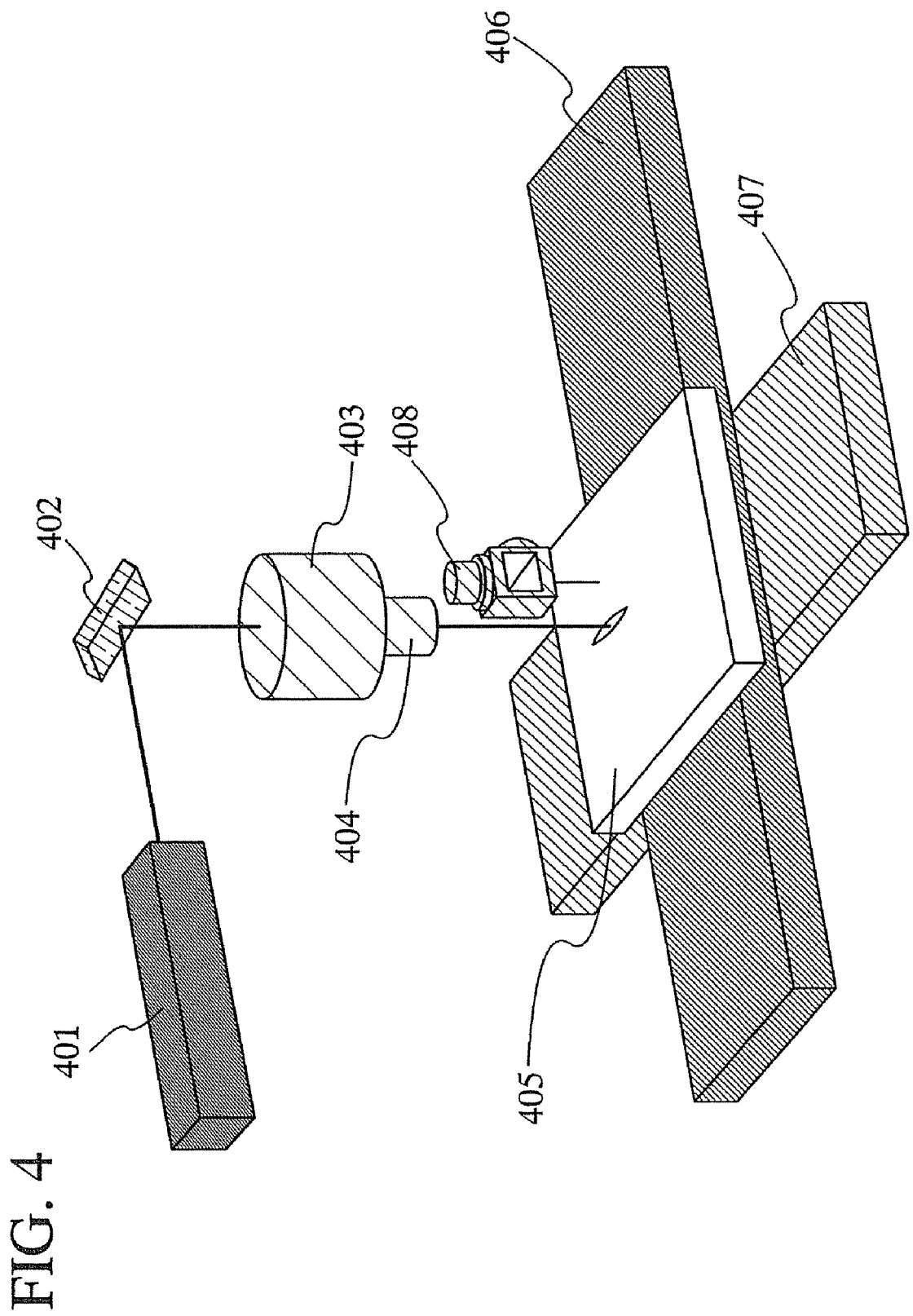
FIG. 4 is a drawing showing a laser irradiation method of the present invention.

In FIG. 4, a first laser beam is emitted from a laser oscillator 401 (a CW laser or a pulsed laser with a repetition rate of 10 MHz or more), and reflected on a mirror 402. Then, the laser beam is incident vertically into an irradiation object 405. The laser beam incident vertically into the irradiation object 405 is then incident into an optical system 404 whose height can be controlled by an autofocusing mechanism 403. After that, the laser beam is condensed so as to be linear on the irradiation object 405.

When the CW laser oscillator is used, the first laser beam is made incident into the irradiation object 405 at a certain angle.

As shown in the embodiment mode 2, when the swell exists in the irradiation object 405, the linear beam is formed so that its short side is in parallel to the direction where the irradiation object 405 has fewer swells. The movement of the irradiation object 405 is controlled by an X-axis stage 406 and a Y-axis stage 407. The autofocusing mechanism 403 can move up and down with an autofocusing mechanism 408.

The laser irradiation to the irradiation object 405 may be performed while moving the X-axis stage 406 and the Y-axis stage 407 over which the irradiation object 405 is mounted. Moreover, the laser irradiation may be performed while moving the laser beam.

Figure 5:
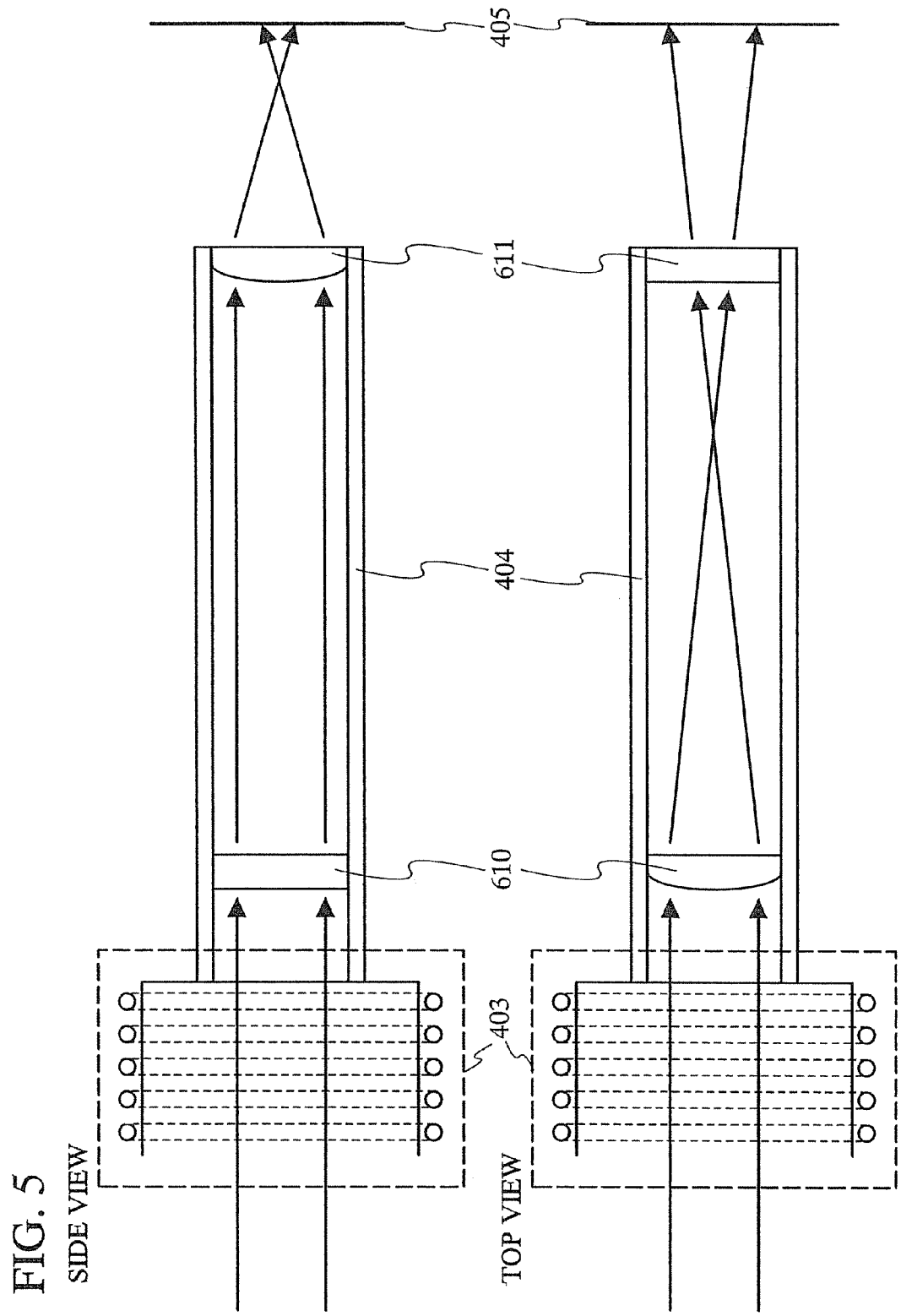
FIG. 5 is a drawing showing an optical system.

The optical system 404 is described in more detail with reference to FIG. 5. FIG. 5 is a cross-sectional view of the optical system 404, and the same reference numerals are given to the same parts in the FIGS. 4 and 5. The optical system 404 includes two cylindrical lenses 610 and 611 acting on different directions respectively. In this embodiment, the cylindrical lens 610 has a focal length of 300 mm and acts on only a long-side direction of the linear beam, and the cylindrical lens 611 has a focal length of 15 mm and acts on only a short-side direction of the linear beam. By using the cylindrical lenses 610 and 611, the laser beam is shaped into a linear spot on the irradiation object 405. The beam spot has a size of approximately 10 μm in the short-side direction and approximately 300 μm in the long-side direction.

Figure 6:
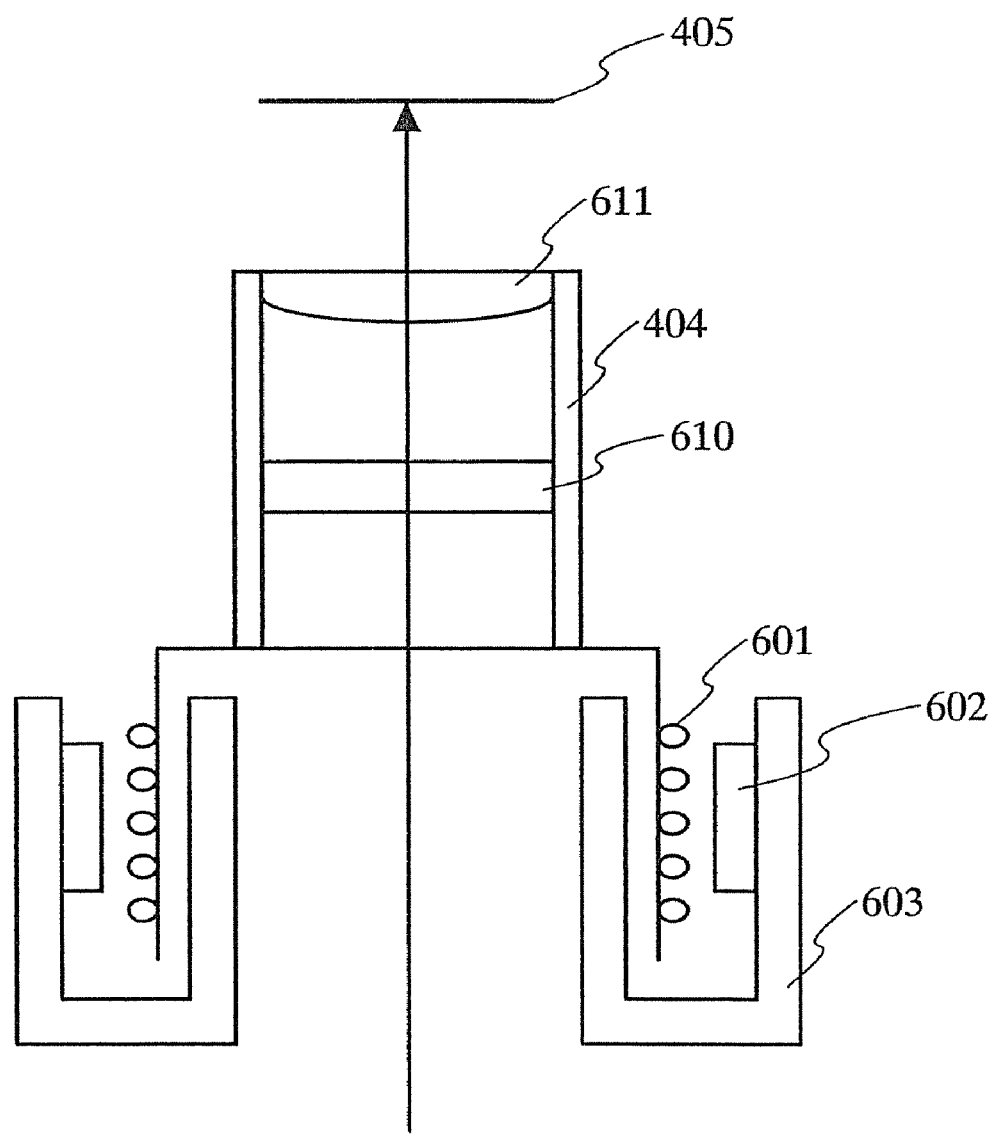
FIG. 6 is a drawing showing an autofocusing mechanism.

Next, the autofocusing mechanism 403 is described with reference to FIG. 6. In FIG. 6, the optical system 404 can move microscopically by a voice coil 601, a magnet 602, and an iron core 603 which wrap around the optical system 404 when a drive current flows from a servo circuit to the voice coil 601.

Next, the autofocusing mechanism 408 is described with reference to FIGS. 7A to 7C. A second laser beam emitted from a laser oscillator 701 is incident into the irradiation object 405 through a convex spherical lens 704 and a cylindrical lens 705, and the reflected laser beam is detected by four-array photodetectors 706 to measure the distance between the irradiation object 405 and the autofocusing mechanism 408. In accordance with the result of the measurement, the autofocusing mechanism 403 moves the optical system 404 up and down to control the distance between the optical system 404 and the irradiation object 405.

The method for measuring the distance between the autofocusing mechanism 408 and the irradiation object 405 is described. In FIGS. 7A to 7C, A polarizing direction of the laser beam emitted from the laser oscillator 701 is rotated by 90° with a λ/2 waveplate 702. After that, the laser beam passes through a beam splitter 703 and is then condensed by the convex spherical lens 704.

When the irradiation object 405 is at the focal point of the convex spherical lens 704 (FIG. 7A), the laser beam reflected on the irradiation object 405 travels along the same optical path as that where the laser beam is incident into the irradiation object 405, and then the laser beam is incident into the convex spherical lens 704. Then, a part of the laser beam is deflected by the beam splitter 703 and is incident into the cylindrical lens 705.

The cylindrical lens 705 is a condensing lens acting on only one direction, and a dotted line indicates an optical path of the laser beam in a direction on which the cylindrical lens 705 acts. The solid line indicates an optical path of the laser beam in a direction on which the cylindrical lens 705 does not act. Here, the beam spot on the four-array photodetectors 706 is circular.

When the irradiation object 405 is before the focal point of the convex spherical lens 704 (FIG. 7B), the laser beam reflected on the irradiation object 405 travels along an optical path inner than the optical path when the laser beam is incident, and then the laser beam is incident into the convex spherical lens 704. After that, a part of the laser beam is deflected by the beam splitter 703, and is incident into the cylindrical lens 705.

The cylindrical lens 705 is a condensing lens acting on only one direction. The dotted line indicates an optical path of the laser beam in a direction on which the cylindrical lens 705 acts. The solid line indicates an optical path of the laser beam in a direction on which the cylindrical lens 705 does not act. Here, the beam spot on the four-array photodetectors 706 is elliptical.

When the irradiation object 405 is after the focal point of the convex spherical lens 704 (FIG. 7C), the laser beam reflected on the irradiation object 405 travels along an optical path outer than the optical path when the laser beam is incident, and then the laser beam is incident into the convex spherical lens 704. After that, a part of the laser beam is deflected by the beam splitter 703, and incident into the cylindrical lens 705.

The cylindrical lens 705 is a condensing lens acting on only one direction. The dotted line indicates an optical path of the laser beam in a direction on which the cylindrical lens 705 acts, and the solid line indicates an optical path of the laser beam in a direction on which cylindrical lens 705 does not act. Here, the beam spot on the four-array photodetectors 706 is elliptical, which is rotated by 90° to the ellipse shown in FIG. 7B.

Therefore, since the beam spot has different shapes on the four-array photodetectors depending on the position of the irradiation object 405, the current value detected by each of the four-array photodetectors is different. Thus, the distance between the irradiation object 405 and the autofocusing mechanism 408 can be measured. When the autofocusing mechanism 408 works with the autofocusing mechanism 403, the distance between the optical system 404 and the irradiation object 405 can be made constant.

The present embodiment mode 3 can be freely combined with the embodiment mode 1 or 2.

Embodiment Mode 4

Figure 9:
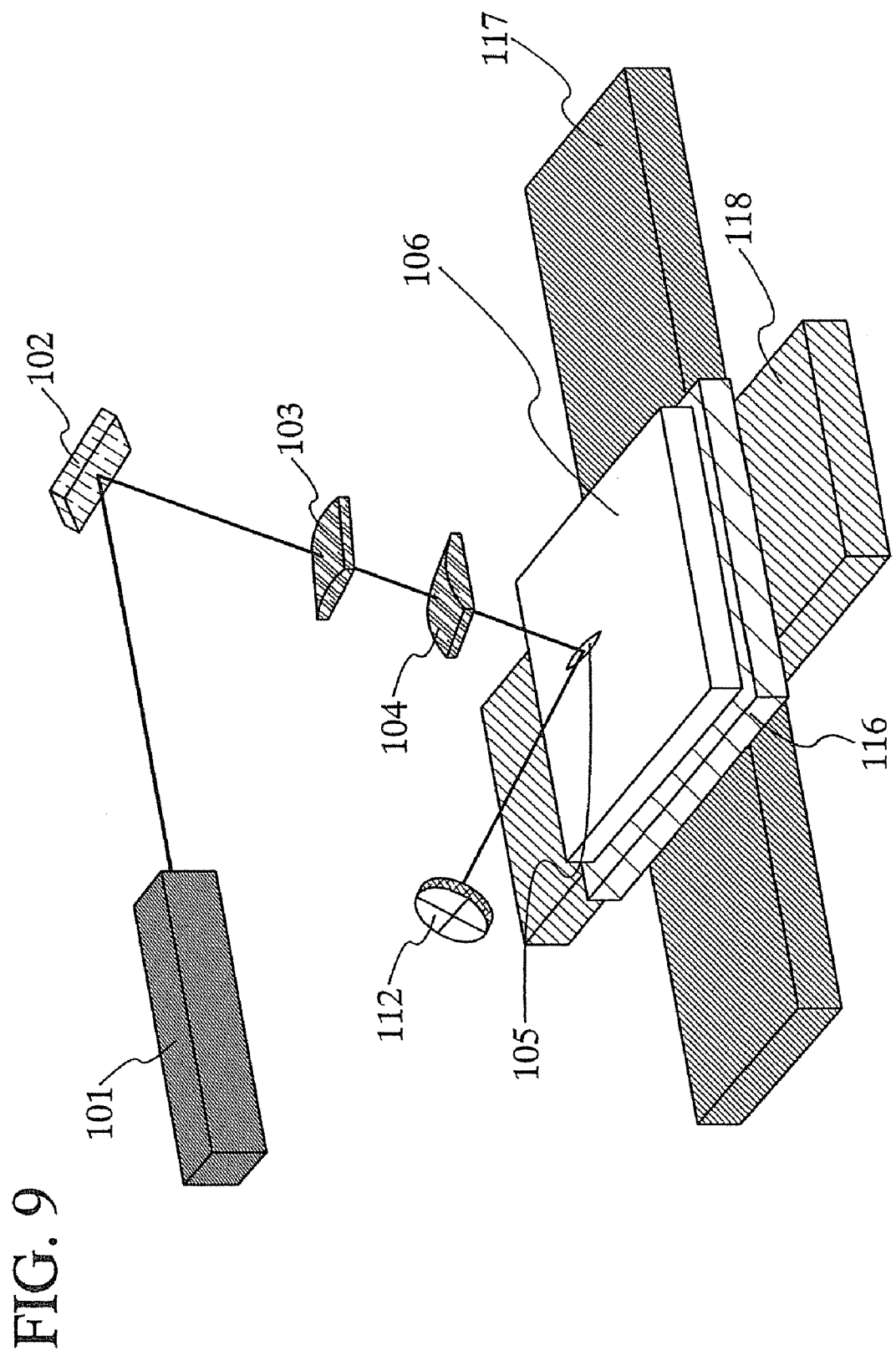
FIG. 9 is a drawing showing a laser irradiation method of the present invention.
Figure 10:
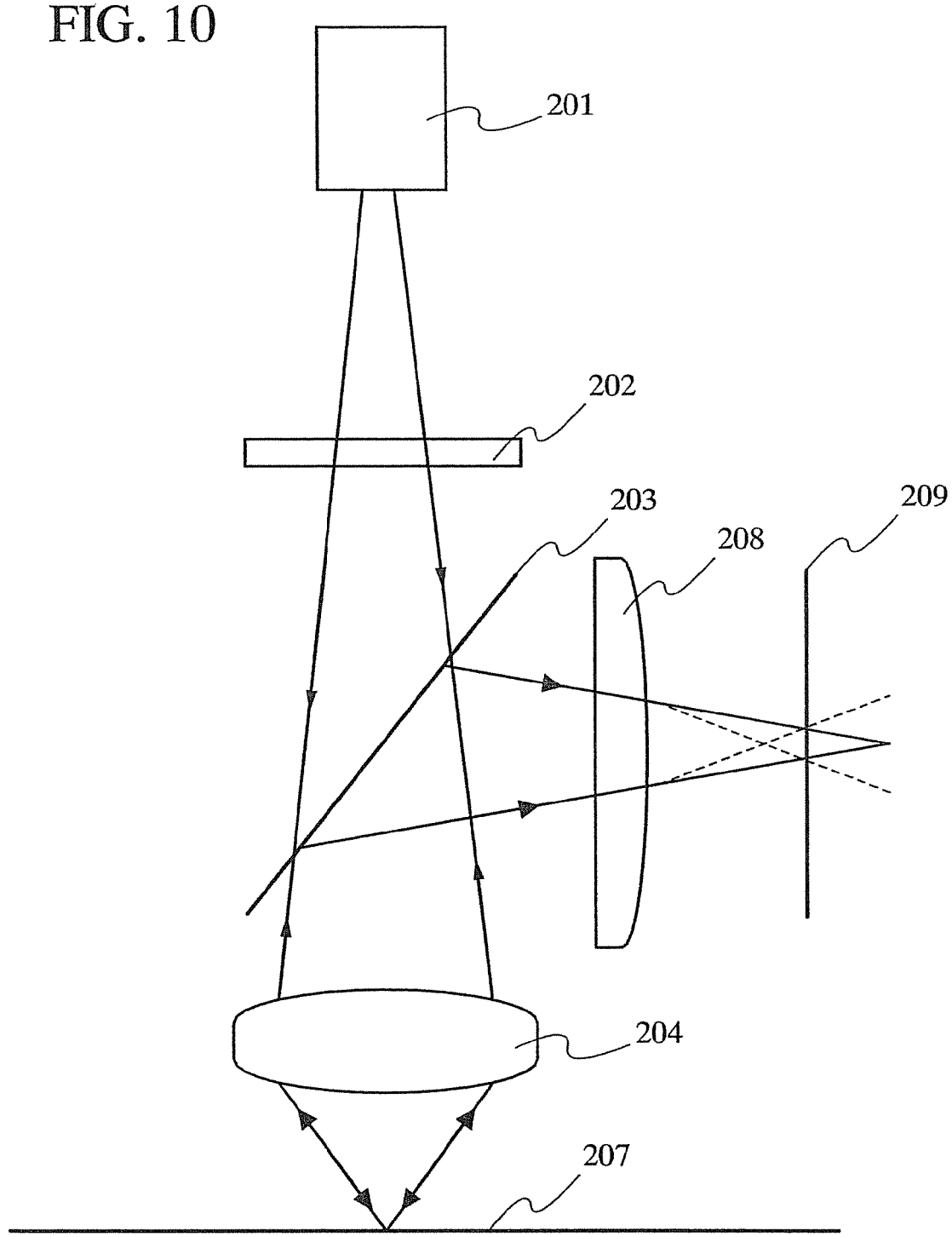
FIG. 10 is a drawing showing a laser irradiation method of the present invention.

With reference to FIGS. 9 and 10, this embodiment mode describes an example of laser irradiation using the autofocusing by one laser oscillator.

In FIG. 9, a laser beam emitted from a laser oscillator 101 is reflected on a mirror 102 so that the traveling direction of the laser beam changes to be oblique with respect to a surface of an irradiation object 106. After that, the laser beam is incident into the cylindrical lenses 103 and 104 which can respectively condense the laser beam in different directions, and the laser beam is condensed so that a linear beam spot 105 is formed on the irradiation object 106.

The irradiation object 106 can be moved by a Z-axis stage 116, an X-axis stage 117, and a Y-axis stage 118. The Z-axis stage 116 can adjust the tilt of the irradiation object 106 and move the irradiation object 106 upward and downward.

Moreover, an autofocusing mechanism for keeping the distance between the irradiation object 106 and the cylindrical lenses 103 and 104 constant is provided. In this embodiment mode, the laser beam emitted from the laser oscillator 101 is made incident obliquely into the irradiation object 106, and the reflected laser beam is detected by the four-array photodetectors 112, and thus, the autofocusing is performed. In other words, the laser beam emitted from the laser oscillator 101 is also used as a laser beam for the autofocusing. For example, when the irradiation object 106 is a semiconductor film, the laser beam emitted from the laser oscillator 101 can work both as the laser beam for annealing the semiconductor film and as the laser beam for the autofocusing.

The distance between the irradiation object 106 and the cylindrical lenses 103 and 104 can be controlled by detecting the laser beam reflected on the irradiation object 106 using the four-array photodetectors in the same way as the configuration shown in FIG. 2 and FIGS. 3A to 3E.

It is preferable to use the CW laser oscillator in this case. When the CW laser oscillator is used in the laser irradiation, however, the incident laser beam may interfere with the laser beam reflected on the rear surface of the irradiation object 106 on the irradiation object 106. To avoid the interference of the laser beams, the laser beam may be made incident into the irradiation object 106 at a certain angle or more so that the incident beam does not overlap the reflected beam on the irradiation object 106. Since the FIG. 9 shows the configuration in which the laser beam is incident obliquely, this configuration is suitable for the case of using the CW laser.

FIG. 10 shows a laser irradiation method in which the laser beam is incident vertically and the autofocusing is performed by one laser oscillator.

A laser oscillator 201 is a mode-locked pulsed laser oscillator with a repetition rate of 10 MHz or more. A polarizing direction of the laser beam emitted from the laser oscillator 201 is rotated by 90° with a polarizing plate 202. After that, the laser beam passes through a beam splitter 203, and is condensed on an irradiation object 207 by a condensing lens 204. The condensed laser beam can be used to perform the laser irradiation such as annealing.

Figures 7A, 7B, 7C:
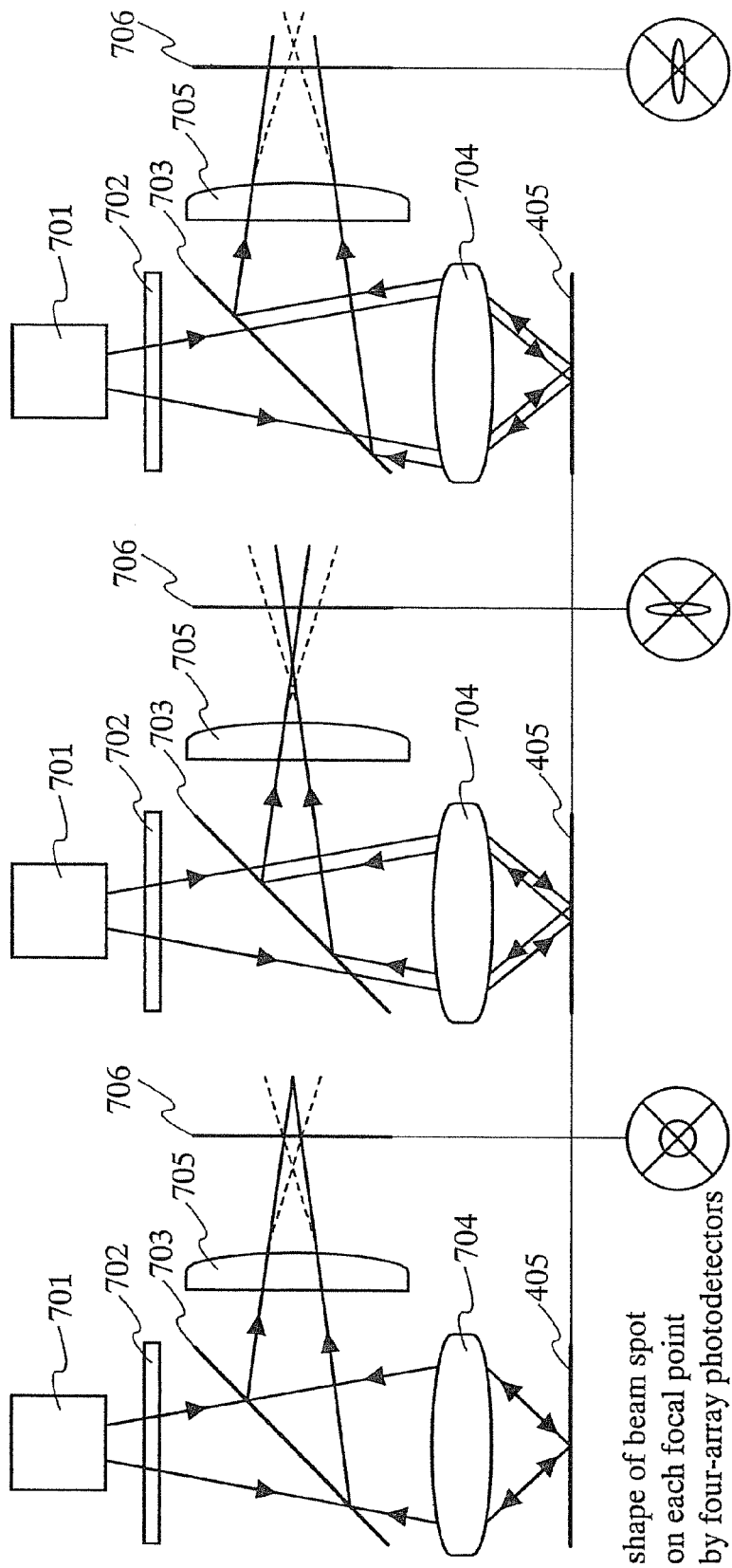
FIGS. 7A to 7C are a drawing showing an autofocusing mechanism.

As shown in FIGS. 7A to 7C, the laser beam reflected on the irradiation object 207 is incident into the condensing lens 204, and detected by four-array photodetectors 209 through the beam splitter 203 and the cylindrical lens 208. The detected laser beam is converted into an electric signal by the four-array photodetectors 209. By moving the condensing lens 204 or the irradiation object 207 so that the electric signals detected by the respective photodetectors are equal, the distance between the condensing lens and the irradiation object can be made constant.

As shown in FIG. 10, when the laser beam is incident vertically into the irradiation object 207, for example, a laser having a short pulse width of several tens ps or less may be used. Even when the short pulsed laser beam is incident vertically, the interference between the incident beam and the laser beam reflected on the rear surface of the irradiation object 207 does not affect the homogeneous laser irradiation. Accordingly, in the case of using the laser having a short pulse width of several tens ps or less, the homogeneous laser irradiation can be performed without being affected by the interference of the beam when the laser beam is delivered to the irradiation object vertically.

When the irradiation object has the swell, the autofocusing may be performed in consideration of the swell as shown in the embodiment mode 2. This embodiment mode 4 can be freely combined with any one of the embodiment modes 1 to 3.

Embodiment Mode 5

The present invention can be applied to the laser irradiation performed to any object whose thickness is not even. Moreover, the present invention can be applied not only to laser irradiating but also to electron beam imaging or ion beam imaging. This embodiment mode describes a laser irradiation method when using a laser direct imaging system with reference to FIG. 14.

Figure 14:
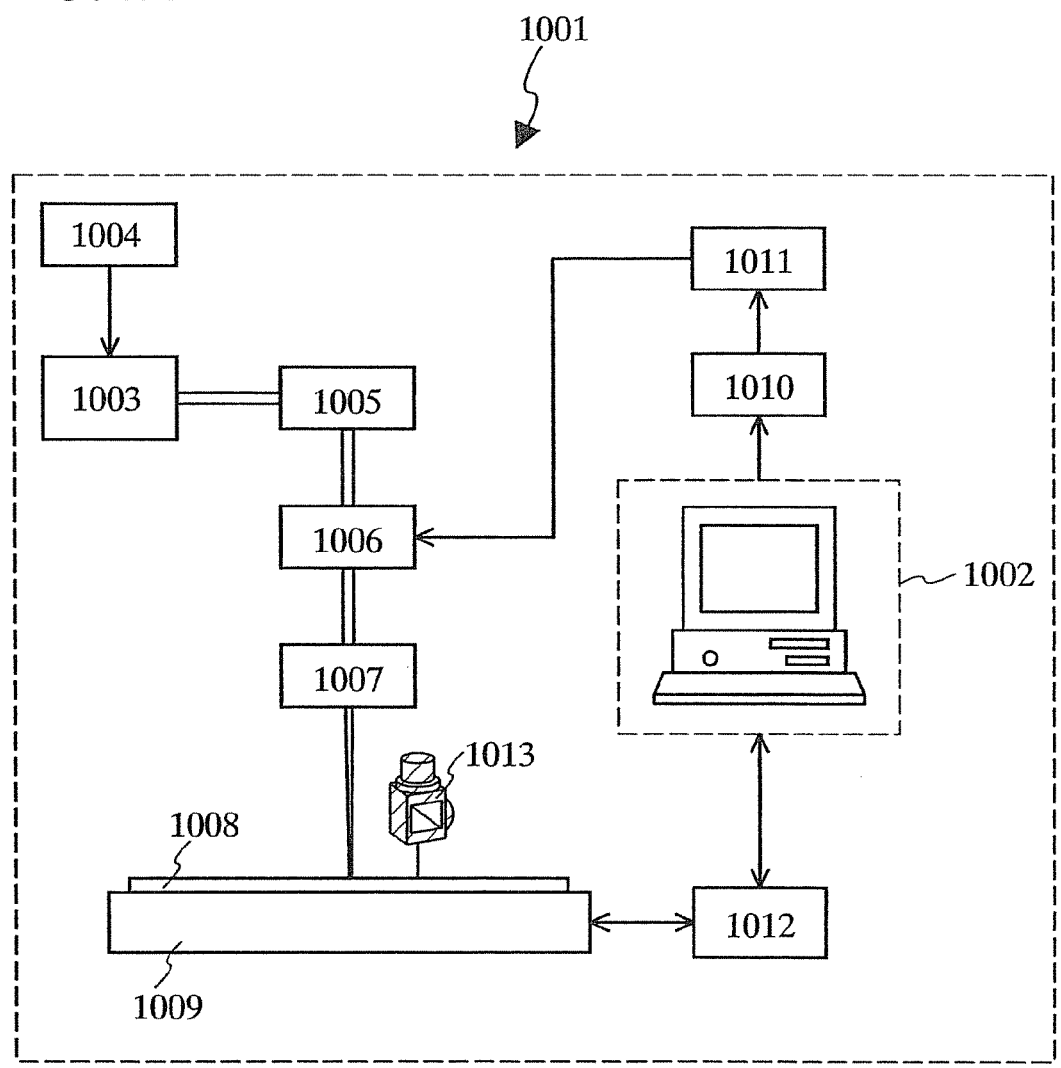
FIG. 14 is a drawing showing a laser irradiation method of the present invention.

As shown in FIG. 14, a laser direct imaging system 1001 includes a computer 1002 (hereinafter referred to as a PC) for executing various controls in the laser irradiation; a laser oscillator 1003 for emitting the laser beam; a power source 1004 of the laser oscillator 1003; an optical system 1005 for attenuating the laser beam (an ND filter); an acousto-optic modulator (AOM) 1006 for modulating the intensity of the laser beam; an optical system 1007 including a lens for reducing the cross section of the laser beam, a mirror for changing the optical path of the laser beam, and the like; a substrate-moving mechanism 1009 including an X-axis stage and a Y-axis stage; a D/A converter 1010 for digital-analog converting the control data outputted from the PC; a driver 1011 for controlling the acousto-optic modulator 1006 in accordance with the analog voltage outputted from the D/A converter 1010; and a driver 1012 for outputting a driver signal to drive the substrate-moving mechanism 1009. An autofocusing mechanism 1013 is also provided.

The laser oscillator 1003 may be a laser oscillator capable of emitting an ultraviolet, visible, or infrared beam. Specifically, the laser oscillator 1003 may be, for example, an ArF excimer laser, a KrF excimer laser, a XeCl excimer laser, or a Xe excimer laser. Moreover, a gas laser oscillator such as a He laser, a He—Cd laser, an Ar laser, a He—Ne laser, or a HF laser can be used. In addition, a solid-state laser oscillator using a crystal such as YAG, $GdVO_4$, $YVO_4$, YLF, or $YAlO_3$ each of which is doped with Cr, Nd, Er, Ho, Ce, Co, Ti, or Tm can be used. Furthermore, a semiconductor laser oscillator such as a GaN laser, a GaAs laser, a GaAlAs laser, or an InGaAsP laser can be used. When the solid-state laser oscillator is used, it is preferable to use the fundamental wave or any one of the second to fifth harmonics.

Next, the laser irradiation method using the laser direct imaging system is described. When a substrate 1008 is mounted over the substrate-moving mechanism 1009, the PC 1002 detects the position of a marker formed over the substrate using a camera (not shown). Subsequently, the PC 1002 produces motion data for moving the substrate-moving mechanism 1009 based on the detected positional data of the marker and the image pattern data inputted in advance.

Then, after the optical system 1005 attenuates the laser beam emitted from the laser oscillator 1003, the acousto-optic modulator 1006 controls the amount of the light emission so as to be the predetermined amount in such a way that the PC 1002 controls the amount of the laser beam outputted from the acousto-optic modulator 1006 through the driver 1011. Meanwhile, the laser beam emitted from the acousto-optic modulator 1006 passes through the optical system 1007 so that the optical path and the beam spot shape of the laser beam are changed. After condensing the laser beam by the lens, the laser beam is delivered to a light-absorbing layer formed over the substrate.

Here, the substrate-moving mechanism 1009 is controlled so as to move in the X-direction and the Y-direction based on the motion data produced by the PC 1002. As a result, a predetermined region is irradiated with the laser beam, and the energy density of the laser beam is converted into heat energy in the light-absorbing layer.

In the case of the laser irradiation using the laser direct imaging system, it is necessary to focus the beam spot of the laser beam on the light-absorbing layer formed over the substrate through the lens. Accordingly, the distance between the optical system 1007 and the substrate 1008 is made the same using the autofocusing mechanism 1013 as shown in the embodiment mode 1 or 3. Moreover, when the pattern is formed over the substrate such as a glass substrate which has the swell by the laser direct imaging system, the autofocusing mechanism can be used in consideration of the swell as shown in the embodiment mode 2. The distance between the optical system 1007 and the substrate 1008 may be controlled by moving the optical system 1007 as shown in FIG. 4 or by moving the substrate 1008 as shown in FIG. 1.

To form a microscopic pattern by the laser direct imaging system, the beam spot needs to be small. This leads to the problem of shallow focal depth. For this reason, it is very effective to use the autofocusing mechanism in the laser irradiation by the laser direct imaging system.

The present embodiment mode 5 can be freely combined with any one of the embodiment modes 1 to 4.

Embodiment Mode 6

Figure 15:
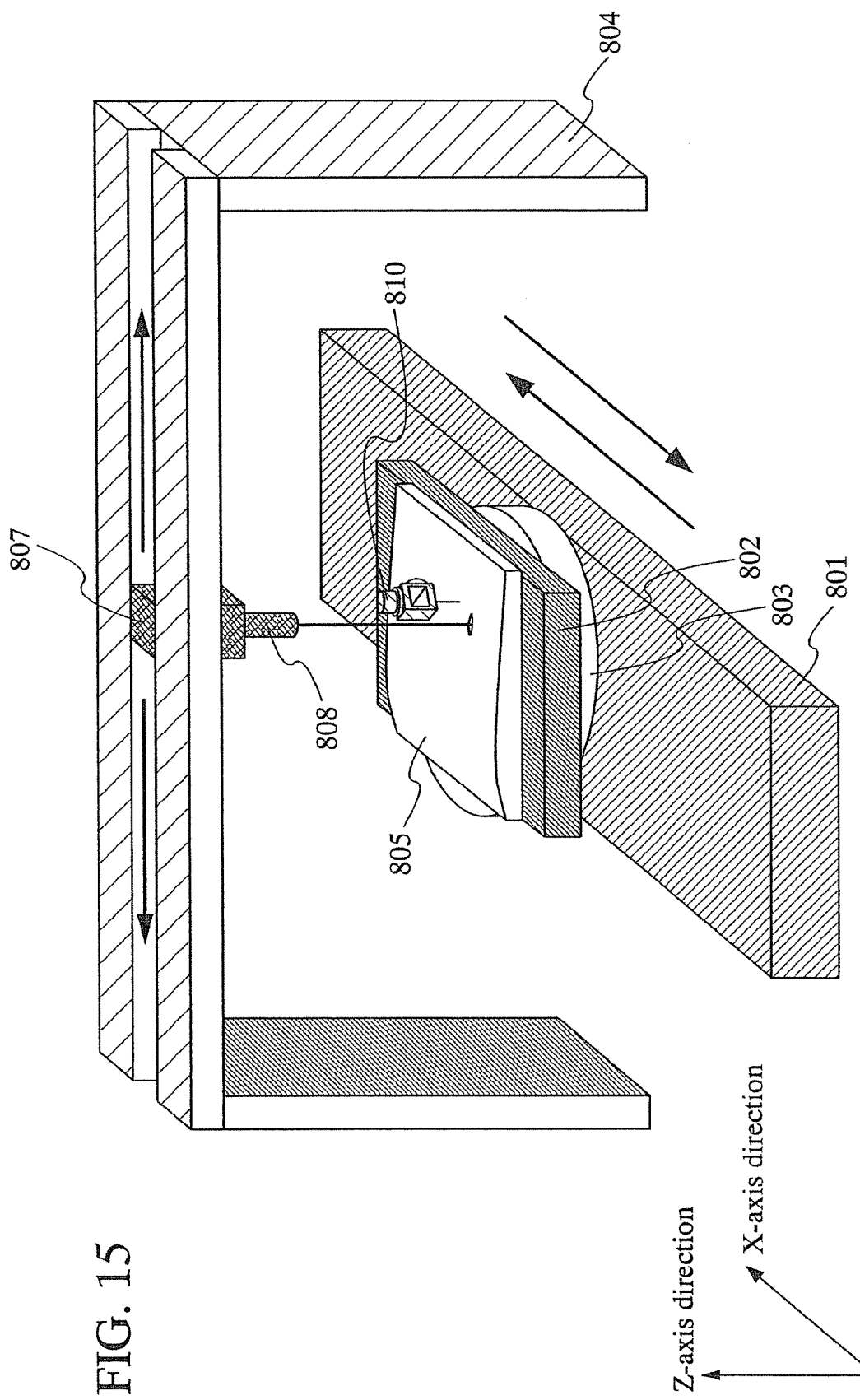
FIG. 15 is a drawing showing a laser irradiation method of the present invention.

With reference to FIG. 15, the embodiment mode 6 describes an example of the laser irradiation by moving both of a laser beam and a scanning stage with an irradiation object mounted.

In FIG. 15, an irradiation object 805 is mounted over a rotating stage 803, and the rotating stage 803 is mounted over an X-axis scanning stage 801 which moves in one direction of an X-axis direction.

Moreover, a Y-axis scanning stage 804 is provided so as to bridge over the X-axis scanning stage 801. The Y-axis scanning stage 804 has a laser oscillator 807 for emitting the laser beam and an optical system 808 for condensing the laser beam on the irradiation object. It is preferable that the beam spot formed on the irradiation object by the optical system 808 is elongate, for example rectangular, elliptical, or linear, because the laser irradiation can be performed effectively. The laser oscillator 807 and the optical system 808 can be moved in the Y-axis direction.

The laser oscillator 807 is not limited in particular, and it may be a CW laser oscillator or a pulsed laser oscillator. Moreover, the laser oscillator 807 may be a semiconductor laser. Since the semiconductor laser is compact, it has an advantage that it can be moved easily.

An autofocusing mechanism 810 for keeping the distance between the optical system 808 and the irradiation object 805 constant is provided. The autofocusing may be performed with any one of the configurations shown in the embodiment modes 1 to 5. In this embodiment mode, the distance between the optical system 808 and the irradiation object 805 is measured with the configuration shown in FIGS. 7A to 7C. Based on the result of the measurement, a Z-axis stage 802 is moved to control the distance between the optical system 808 and the irradiation object 805. Although the irradiation object 805 is moved in this embodiment mode, the optical system 808 may be moved in the Z-axis direction to control the distance between the optical system 808 and the irradiation object 805.

When the irradiation object 805 has the swell as shown in FIG. 8, the laser irradiation is performed in consideration of the swell. For example, the laser irradiation may be performed as follows when the irradiation object 805 has the swell along the Y-axis direction.

First, a beam spot is formed so that its short side is parallel to the X-axis direction, and the irradiation object 805 is moved in the X-axis direction. After irradiating the irradiation object 805 once from one end thereof to the other end, the laser oscillator 807 and the optical system 808 provided to the Y-axis scanning stage 804 are moved in the Y-axis direction. After the laser oscillator 807 and the optical system 808 are moved in the Y-axis direction, the autofocusing mechanism 810 corrects the distance between the optical system 808 and the irradiation object 805 which has been displaced due to the swell. Then, the laser beam is delivered to the irradiation object 805 from one end thereof to the other end by moving the irradiation object in the direction opposite to the previous X-axis direction, and the laser oscillator 807 is moved in the Y-axis direction again. By repeating the above operation, the laser irradiation can be performed homogeneously to the whole surface of the substrate even when the substrate has the swell.

The movement in the X-axis direction or the Y-axis direction at the laser irradiation may be set appropriately by a practitioner. For example, when a semiconductor film as the irradiation object 805 is crystallized by the laser irradiation, the semiconductor film is moved in the X-axis direction at the speed appropriate for the crystallization. The moving speed is preferably in the range of 100 nm/s to 20 m/s, more preferably 10 to 100 cm/s. Moreover, when the laser oscillator 807 and the optical system 808 are moved in the direction (Y-axis direction) parallel to the long-side direction of the beam spot, it is preferable to move them correctly in order to control the irradiation position of the laser beam.

In this case, the laser oscillator 807 is moved slowly in the Y-axis direction, and the irradiation object 805 is moved in the X-axis direction. However, they may be opposite. Further, the laser oscillator 807 may be moved in both X-axis direction and Y-axis direction without moving the irradiation object 805.

The embodiment mode 6 can be freely combined with any one of the embodiment modes 1 to 5.

Embodiment Mode 7

This embodiment mode describes a laser irradiation method different from the above embodiment mode. Specifically, an autofocusing mechanism in this embodiment mode is different from that in the above embodiment mode.

Figure 17A:
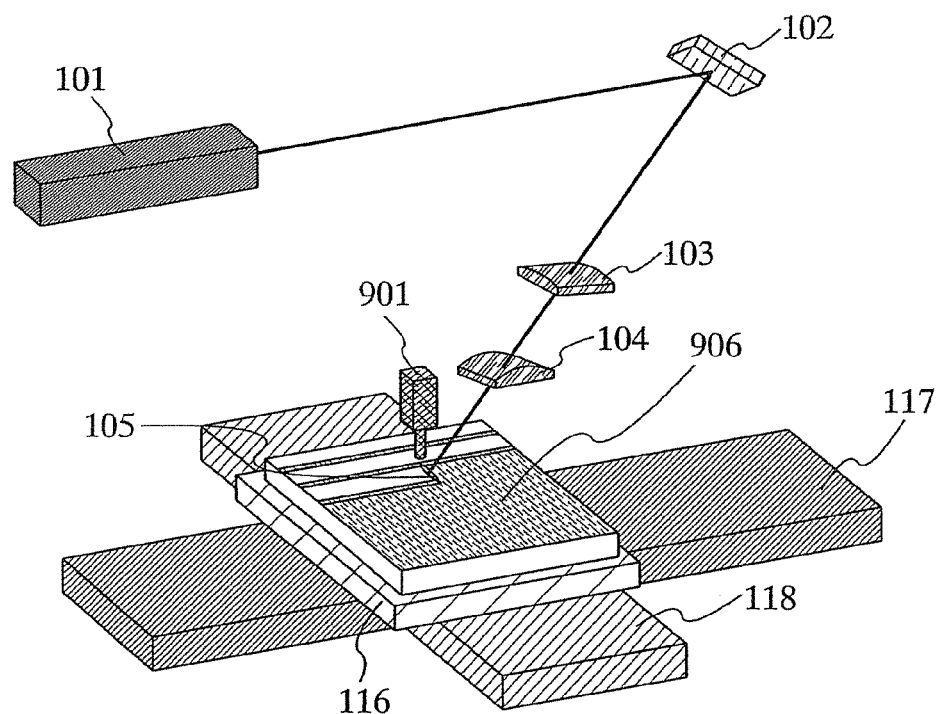
FIGS. 17A and 17B are drawings showing a laser irradiation method of the present invention.
Figure 17B:
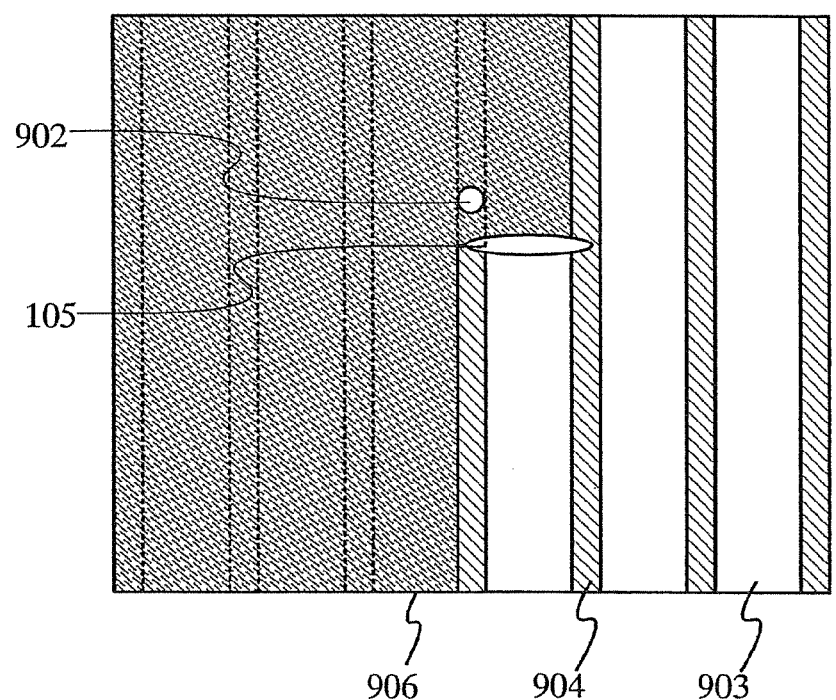

FIGS. 17A and 17B show an example of the laser irradiation method using a contact displacement sensor as the autofocusing mechanism. This embodiment mode shows the step of annealing a semiconductor film 906 by irradiating the semiconductor film 906 obliquely with the laser beam.

In FIGS. 17A and 17B, a laser beam emitted from a laser oscillator 101 is reflected on a mirror 102, and incident obliquely into the semiconductor film 906 through cylindrical lenses 103 and 104 to form a linear beam spot 105 on the semiconductor film 906. The cylindrical lenses 103 and 104 act on different directions respectively. In this embodiment mode, the laser oscillator 101 is a CW laser oscillator.

The semiconductor film 906 can be moved by the Z-axis stage 116, the X-axis stage 117, and the Y-axis stage 118. The Z-axis stage 116 can adjust the tilt of the semiconductor film 906 and move it upward or downward. The whole surface of the semiconductor film 906 can be annealed by irradiating the semiconductor film 906 with the laser beam while moving the semiconductor film 906 relative to the laser beam.

An autofocusing mechanism is provided to keep the distance between the semiconductor film 906 and the cylindrical lenses 103 and 104 constant. In this embodiment mode, a contact displacement sensor 901 is used to control the distance between the semiconductor film 906 and the cylindrical lenses 103 and 104 by contacting the semiconductor film 906 directly. The contact displacement sensor 901 may be any contact displacement sensor when it can control the distance in upward and downward directions by contacting the semiconductor film 906.

When the semiconductor film 906 is annealed by the laser irradiation using the CW laser as the laser oscillator 101, two regions are generally formed in the irradiated portion. One of them is a large crystal grain region 903 in which the crystal grain is large and the other is an inferior crystallinity region 904 in which the crystallization is not performed sufficiently. Since the beam spot 105 has power density distribution, the inferior crystallinity region 904 is formed in a part of the semiconductor film 906 corresponding to the opposite ends of the beam spot 105. Generally, since the crystallization is not performed sufficiently in the inferior crystallinity region 904, the inferior crystallinity region 904 is not suitable for manufacturing a semiconductor element; therefore it is removed in the following step.

When the contact displacement sensor 901 is used as the autofocusing mechanism, a probe of the contact displacement sensor 901 directly contacts the semiconductor film 906, which may result in that a part of the semiconductor film 906 where the probe contacts is contaminated with the impurity or damaged. However, in the case of using the CW laser as described above, such concerns can be reduced when the probe contacts the inferior crystallinity region 904, which is formed by the CW laser and will be removed in the following step, to measure the displacement of the semiconductor film 906 in the upward or downward direction. Thus, the autofocusing can be performed without affecting the semiconductor film 906.

To measure the distance between the semiconductor film 906 and each of the cylindrical lenses 103 and 104 accurately, it is preferable to measure by contacting the probe 902 of the contact displacement sensor in the vicinity of the part of the semiconductor film where the laser beam is delivered. In this embodiment mode, since the laser beam is incident obliquely, the contact displacement sensor 901 can be provided easily over the beam spot 105 formed on the semiconductor film 906.

Although this embodiment mode has shown the example of using the CW laser, a pulsed laser with a repetition rate of 10 MHz or more may be used. The autofocusing mechanism may be not only the contact displacement sensor but also an electrostatic capacity displacement sensor, an eddy current displacement sensor, or the like.

This embodiment mode 7 can be freely combined with any one of the embodiment modes 1 to 6.

Embodiment Mode 8

This embodiment mode describes an example of a method for manufacturing a semiconductor device using a laser irradiation method of the present invention. Although this embodiment mode describes a light-emitting device as one of semiconductor devices, the semiconductor device which can be manufactured by the present invention is not limited to the light-emitting device, and it may be a liquid-crystal display device or other semiconductor device.

The light-emitting device is a semiconductor device having a light-emitting element and a unit for supplying current to the light-emitting element in each of a plurality of pixels. The light-emitting element typified by an OLED (Organic Light-Emitting Diode) has an anode, a cathode, and a layer (electroluminescent layer) including an electroluminescent material that gives luminescence by applying an electric field thereto. The electroluminescent layer is a single layer or multilayers formed between the anode and the cathode. These layers may include an inorganic compound.

Figure 11A:
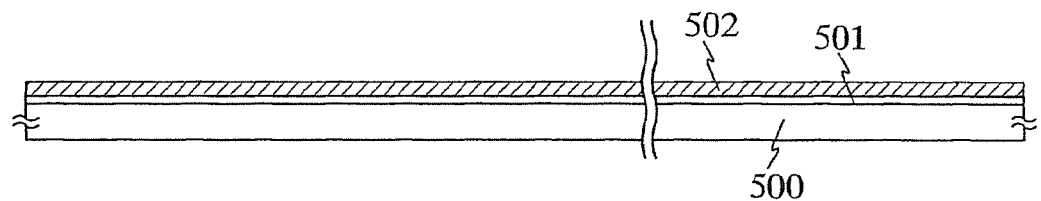
FIGS. 11A to 11E are drawings showing steps for manufacturing a semiconductor device using a laser irradiation method of the present invention.

First, a substrate 500 over which a TFT (thin film transistor) will be formed is prepared as shown in FIG. 11A. The substrate 500 may be, for example, a glass substrate made from barium borosilicate glass or aluminoborosilicate glass. Moreover, a quartz substrate or a ceramic substrate may be used. Furthermore, a metal or semiconductor substrate with an insulating film formed thereover may be used. Although a flexible substrate made from synthetic resin such as plastic is generally inferior to the above substrates in the heat resistance, the flexible substrate can be used when it can resist the processing temperature in the manufacturing steps. A surface of the substrate 500 may be polished by a CMP method or the like so as to be planarized.

Next, a base film 501 including an insulating material such as silicon oxide, silicon nitride, or silicon oxynitride may be formed over the substrate 500 by a known method (a sputtering method, an LPCVD method, a plasma CVD method, or the like). Although the base film 501 is a single insulating film in this embodiment mode, the base film 501 may include two or more insulating layers.

Next, an amorphous semiconductor film 502 is formed in 50 nm thick over the base film 501 by the plasma CVD method. Then, a dehydrogenation process is performed. Depending on the hydrogen content in the amorphous semiconductor film, it is preferable that the amorphous semiconductor film is dehydrogenated at temperatures from 400 to 550° C. for several hours. The following crystallization process is desirably performed after the hydrogen content in the amorphous semiconductor film decreases to 5 atoms % or less by the dehydrogenation process. The amorphous semiconductor film may be formed by another method such as the sputtering method or the evaporation method. In any method, it is preferable to decrease the impurity element in the amorphous semiconductor film such as oxygen or nitrogen sufficiently.

Not only silicon but also silicon germanium can be used as the semiconductor. When the silicon germanium is used, the density of the germanium may range from approximately 0.01 to 4.5 atomic %.

In this embodiment mode, both of the base film 501 and the amorphous semiconductor film 502 are formed by the plasma CVD method. In this case, the base film 501 and the amorphous semiconductor film 502 may be formed continuously in vacuum. By forming the base film 501 and the amorphous semiconductor film 502 continuously without exposing them to the air, it is possible to prevent the interface therebetween from being contaminated and to reduce the variation of the characteristic of the TFTs to be manufactured.

Figure 11B:
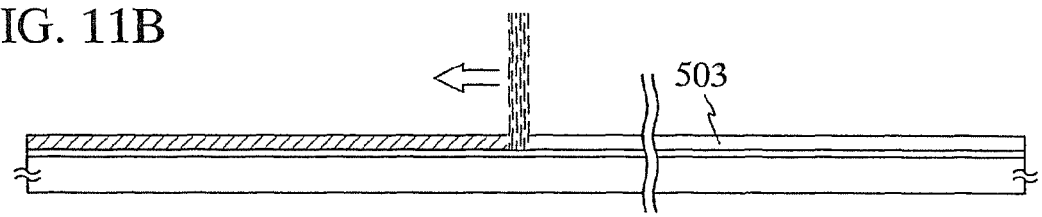

Next, the amorphous semiconductor film 502 is crystallized by a laser crystallization method as shown in FIG. 11B using the autofocusing mechanism of the present invention. The amorphous semiconductor film 502 may be crystallized by not only the laser crystallization method but also other known crystallization method such as a thermal crystallization method using RTA or an annealing furnace or a thermal crystallization method using a metal element for promoting the crystallization.

When the amorphous semiconductor film is crystallized by the second, third, or fourth harmonic of the fundamental wave of a continuous wave solid-state laser, a large crystal grain can be obtained. Typically, it is desirable to use the second (532 nm) or third harmonic (355 nm) of a Nd:YVO$_4$ laser (fundamental wavelength 1064 nm). Specifically, the laser beam emitted from the continuous wave YVO$_4$ laser is converted into the harmonic with a power of 10 W by a non-linear optical element. The non-linear optical element may be set in the resonator with the YVO$_4$ crystal to emit the harmonic. Then, the amorphous semiconductor film, which is the processing object, is irradiated with the laser beam that is preferably shaped into a rectangular or elliptical spot on the irradiation surface by the optical system. The energy density needs to be in the range of approximately 0.01 to 100 MW/cm$^2$ (preferably 0.1 to 10 MW/cm$^2$). The laser irradiation is performed while moving the amorphous semiconductor film 502 relative to the laser beam at the speed from approximately 10 to 2000 cm/s. When the substrate has the swell, the laser irradiation is preferably performed in consideration of the swell as shown in FIG. 8.

The laser irradiation can be performed using a continuous wave gas or solid-state laser. The continuous wave gas laser is, for example, an Ar laser or a Kr laser. The continuous wave solid-state laser is, for example, a YAG laser, a YVO$_4$ laser, a GdVO$_4$ laser, a YLF laser, a YAlO$_3$ laser, an alexandrite laser, a Ti: Sapphire laser, or a Y$_2$O$_3$ laser. As the continuous wave solid-state laser, a laser using a crystal such as YAG, YVO$_4$, YLF, YAlO$_3$, GdVO$_4$, or the like each of which is doped with Cr, Nd, Er, Ho, Ce, Co, Ti, Yb, or Tm can be also used. Although the fundamental wavelengths of these lasers depend on the doped element, they are approximately 1 µm. The harmonic of the fundamental wave can be obtained by using the non-linear optical element.

A crystalline semiconductor film 503 having its crystallinity enhanced is formed by performing the laser crystallization as above.

Figure 11C:
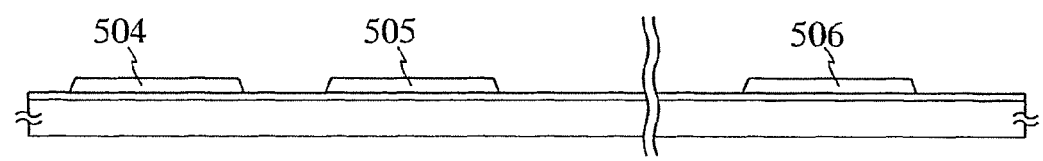

Next, the crystalline semiconductor film 503 is patterned into a desired shape to form island-shaped semiconductor films 504 to 506 which become active layers of TFTs (FIG. 11C). To control the threshold value of the TFT, a small amount of impurity elements (boron or phosphorous) may be doped after forming the island-shaped semiconductor films 504 to 506.

Figure 11D:
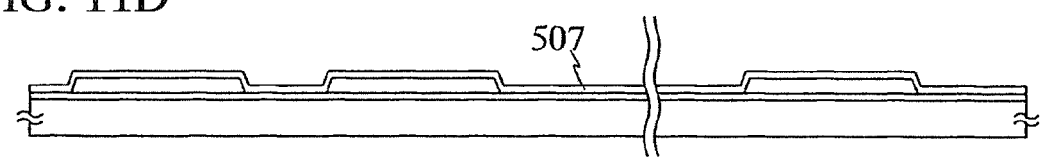

Next, a gate insulating film 507 mainly including silicon oxide or silicon nitride is formed so as to cover the island-shaped semiconductor films 504 to 506 to be active layers as shown in FIG. 11D. In this embodiment mode, a silicon oxide film is formed by the plasma CVD method under the condition where TEOS (tetraethyl orthosilicate) is mixed with O$_2$, the reaction pressure is 40 Pa, the substrate temperature ranges from 300 to 400° C., and the electricity is discharged with high frequency (13.56 MHz) at electric density from 0.5 to 0.8 W/cm$^2$. The silicon oxide film manufactured thus obtains good characteristic as the gate insulating film by performing the thermal annealing at 400 to 500° C. thereafter. The gate insulating film may be formed of aluminum nitride. The aluminum nitride is relatively high in heat conductivity, thereby being able to diffuse the heat generated in the TFT effectively. The gate insulating film may be multilayers in which aluminum nitride is formed over silicon oxide or silicon oxynitride not including aluminum.

Figure 11E:
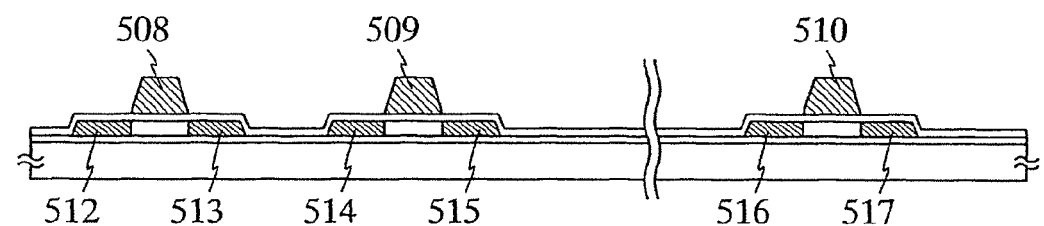

Then, as shown in FIG. 11E, a conductive film is formed in 100 to 500 nm thick over the gate insulating film 507 and patterned to form gate electrodes 508 to 510.

In this embodiment mode, the gate electrode may be formed of an element selected from the group consisting of Ta, W, Ti, Mo, Al, and Cu. Moreover, the gate electrode may be formed of an alloy material or a compound material mainly including any one of the above elements. Furthermore, the gate electrode may be formed of the semiconductor film typified by a poly-crystalline silicon film with the impurity element such as phosphorous doped. The gate electrode may include a single conductive film or plural conductive films.

When the gate electrode is formed of two conductive films, preferable combinations are tantalum nitride (TaN) as the first conductive film and W as the second conductive film, tantalum nitride (TaN) as the first conductive film and Al as the second conductive film, and tantalum nitride (TaN) as the first conductive film and Cu as the second conductive film. Moreover, the first and second conductive films may be a semiconductor film typified by a poly-crystalline silicon film doped with the impurity element such as phosphorous or may be formed of AgPdCu alloy.

The structure of the gate electrode is not limited to the two-layer structure, and it may be a three-layer structure in which, for example, a tungsten film, an aluminum-silicon alloy (Al—Si) film, and a titanium nitride film are laminated sequentially. A tungsten nitride film may be used instead of the tungsten film, an aluminum-titanium alloy (Al—Ti) film may be used instead of the aluminum-silicon alloy (Al—Si) film, and a titanium film may be used instead of the titanium nitride film. It is important to select the optimum etching method and the optimum kind of etchant in accordance with the material of the conductive film.

Next, n-type impurity regions 512 to 517 are formed by adding an n-type impurity element. In this embodiment, an ion doping method using phosphin (PH$_3$) is employed.

Figure 12A:
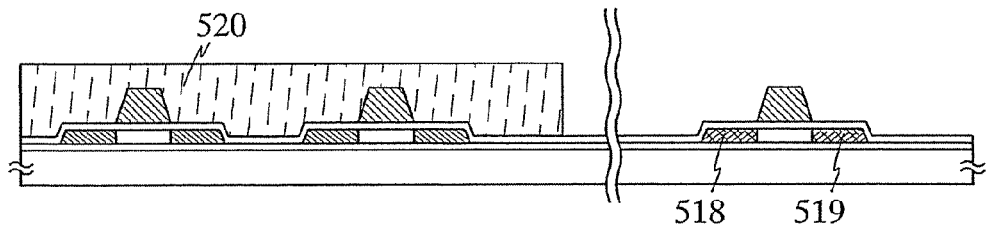
FIGS. 12A to 12E are drawings showing steps for manufacturing a semiconductor device using a laser irradiation method of the present invention.

Next, as shown in FIG. 12A, p-type impurity regions 518 and 519 are formed by adding a p-type impurity element to a region where a p-channel TFT is formed while covering the region where an n-channel TFT is formed with a resist mask 520. In this embodiment mode, an ion doping method using diborane (B$_2$H$_6$) is employed.

Then, the doped impurity elements in the respective island-shaped semiconductor films are activated for the purpose of controlling the electrical conductivity type. This activation process is performed by a thermal annealing method using the annealing furnace. Besides, the laser annealing method and the rapid thermal annealing (RTA) method can be applied. The thermal annealing is performed with the oxygen density of 1 ppm or less, preferably 0.1 ppm or less, in the nitrogenous atmosphere of 400 to 700° C., typically 500 to 600° C. In this embodiment mode, the heat treatment is performed at 500° C. for four hours. However, when the gate electrodes 508 to 510 are sensitive to heat, it is preferable to perform the activation process after forming the interlayer insulating film (mainly including silicon) in order to protect a wiring or the like.

In the case of employing the laser annealing method, the laser used in the crystallization can be used. In the activation process, the scanning speed of the laser beam is the same as that in the crystallization, and the energy density needs to be in the range of approximately 0.01 to 100 MW/cm$^2$ (preferably 0.01 to 10 MW/cm$^2$). The continuous wave laser may be used in the crystallization, and the pulsed laser may be used in the activation.

Next, heat treatment is performed at 300 to 450° C. for 1 to 12 hours in the atmosphere including hydrogen by 3 to 100% to hydrogenate the island-shaped semiconductor film. This is to terminate the dangling bond in the semiconductor film by the hydrogen excited thermally. As other means of hydrogenation, plasma hydrogenation may be performed (using hydrogen excited in plasma).

Figure 12B:
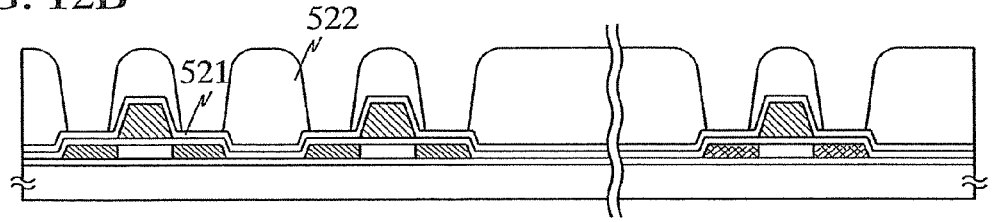

Next, as shown in FIG. 12B, a first inorganic insulating film 521 is formed of silicon oxynitride in 10 to 200 nm thick by a CVD method. The first inorganic insulating film is not limited to the silicon oxynitride film, and it may be an inorganic insulating film including nitrogen that can suppress the access of the moisture to an organic resin film to be formed afterward. For example, silicon nitride, aluminum nitride, or aluminum oxynitride can be used. It is noted that aluminum nitride is relatively high in heat conductivity, thereby being able to diffuse the heat generated in the TFT or the light-emitting element effectively.

An organic resin film 522 is formed of a positive photosensitive organic resin over the first inorganic insulating film 521. Although the organic resin film 522 is formed of the positive photosensitive acrylic in this embodiment mode, the present invention is not limited to this.

In this embodiment mode, the organic resin film 522 is formed by applying positive photosensitive acrylic by a spin coating method and baking it thereafter. The thickness of the organic resin film 522 after the baking is set in the range of approximately 0.7 to 5 μm (preferably 2 to 4 μm).

Next, a part of the organic resin film 522 where an opening portion is to be formed is exposed with the light using a photomask. Then, the organic resin film is developed using a TMAH (tetramethyl ammonium hydroxide)-based developing solution, the substrate is dried, and then the baking is performed at 220° C. for approximately one hour. As shown in FIG. 12B, the opening portion is formed in the organic resin film 522, and the first inorganic insulating film 521 is partially exposed in the opening portion.

Since the positive photosensitive acrylic is colored to be light brown, it is decolorized in the case where the light is emitted from the light-emitting element to the substrate side. In this case, the developed photosensitive acrylic is entirely exposed with light again before the baking. This exposure is performed so that the photosensitive acrylic is exposed completely by extending the exposure time or by irradiating with the light having higher intensity than in the former exposure for forming the opening portion. For example, in the case of decolorizing the positive acrylic resin having a thickness of 2 μm with the use of an equivalent-magnification projecting exposure system (specifically MPA manufactured by Canon Inc.), which utilizes multiwavelengths including a g-line (436 nm), an h-line (405 nm), and an i-line (365 nm) all of which are in the spectrum of light emitted from a super-high pressure mercury lamp, the exposure is performed for approximately 60 seconds. This exposure decolorizes the positive acrylic resin completely.

Although the baking is performed at 220° C. after the development in this embodiment mode, low-temperature prebaking at approximately 100° C. may be performed between the high-temperature baking at 220° C. and the development.

Figure 12C:
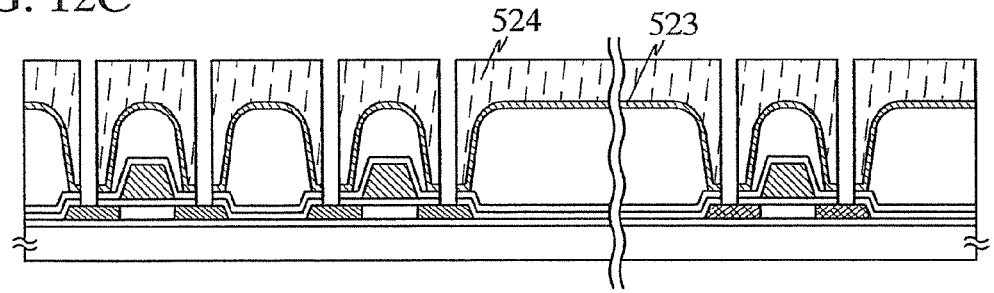

Then, a second inorganic insulating film 523 is formed of silicon nitride by an RF sputtering method so as to cover the organic resin film 522 and the opening portion where the first inorganic insulating film 521 is exposed partially as shown in FIG. 12C. The thickness of the second inorganic insulating film 523 preferably ranges from approximately 10 to 200 nm. The material of the second inorganic insulating film is not limited to silicon nitride, and any inorganic insulating film including nitride that can suppress the access of the moisture to the organic resin film 522 may be used. For example, silicon oxynitride, aluminum nitride, or aluminum oxynitride can be used.

In the case of using the silicon oxynitride film or the aluminum oxynitride film, the proportion between oxygen and nitrogen significantly affects its barrier property. The higher the proportion of nitrogen to oxygen is, the higher the barrier property is. Therefore, it is preferable that the oxynitride film includes more nitrogen than oxygen.

The film formed by the RF sputtering method is highly dense and superior in barrier property. In the case of forming the silicon oxynitride film, the condition in the RF sputtering method is that the gas flow rate of $N_2$, Ar, and $N_2O$ is 31:5:4, the target is Si, the pressure is 0.4 Pa, and the electric power is 3000 W. As another example, in the case of forming the silicon nitride film, the condition is that the gas flow rate of $N_2$ and Ar in the chamber is 20:20, the pressure is 0.8 Pa, the electric power is 3000 W, and the film-forming temperature is 215° C.

The first interlayer insulating film is formed with the organic resin film 522, the first inorganic insulating film 521, and the second inorganic insulating film 523.

Next, as shown in FIG. 12C, a resist mask 524 is formed in the opening portion of the organic resin film 522, and a contact hole is formed to the gate insulating film 507, the first inorganic insulating film 521, and the second inorganic insulating film 523 by a dry etching method.

Due to the opening of this contact hole, the impurity regions 512 to 515, 518, and 519 are partially exposed. The condition of the dry etching is determined appropriately depending on the materials of the gate insulating film 507, the first inorganic insulating film 521, and the second inorganic insulating film 523. Since the gate insulating film 507 is formed with silicon oxide, the first inorganic insulating film 521 is formed with silicon oxynitride, and the second inorganic insulating film 523 is formed with silicon nitride in this embodiment mode, the first inorganic insulating film 521 and the second inorganic insulating film 523 are etched by using $CF_4$, $O_2$, and He as the etching gas, and then the gate insulating film 507 is etched by using $CHF_3$.

It is important that the organic resin film 522 is not exposed in the opening portion when being etched.

Figure 12D:
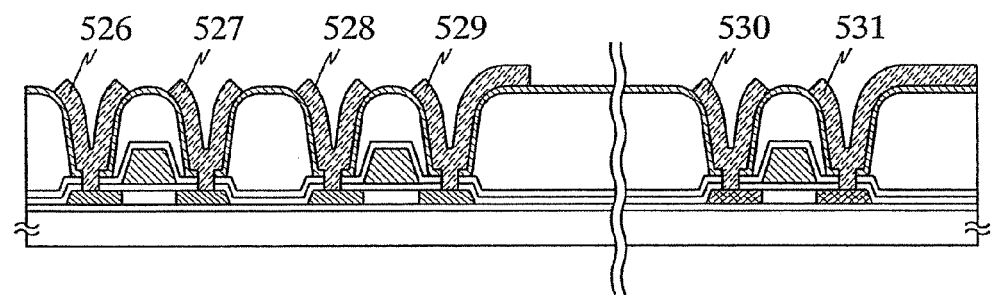

Next, wirings 526 to 531 connected to the impurity regions 512 to 515, 518, and 519 are formed by forming and patterning a conductive film over the second inorganic insulating film 523 so as to cover the contact hole (FIG. 12D).

Although three conductive films are formed with a 100-nm-thick Ti film, a 300-nm-thick Al film, and a 150-nm-thick Ti film continuously over the second inorganic insulating film 523 continuously by the sputtering method in this embodiment mode, the present invention is not limited to this. The conductive film may be a single layer, two layers, or four or more layers. The material of the conductive film is not limited to the above description.

As another example of the conductive film, after forming a Ti film, an Al film including Ti may be laminated thereover. Alternatively, after forming the Ti film, an Al film including W may be laminated thereover.

Next, an organic resin film to be a bank is formed over the second inorganic insulating film 523. Although a positive photosensitive acrylic is used in this embodiment mode, the present invention is not limited to this. In this embodiment mode, the organic resin film is formed by applying the positive photosensitive acrylic by the spin coating method and baking it. The thickness of the organic resin film is set in the range of approximately 0.7 to 5 μm (preferably 2 to 4 μm).

Figure 12E:
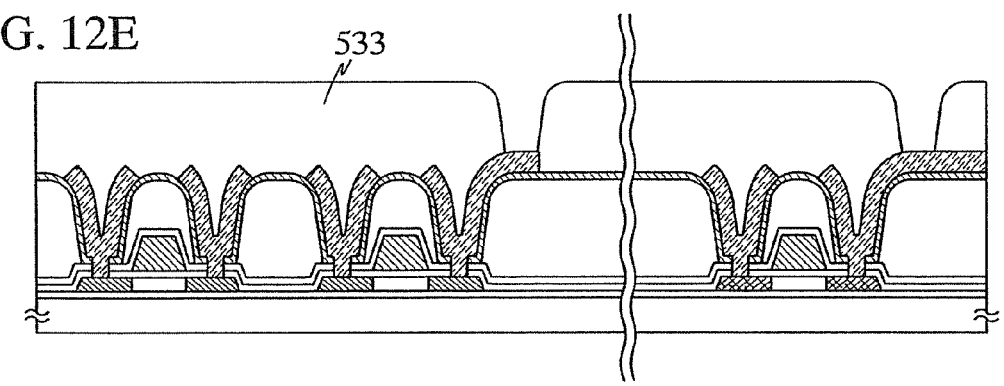

Next, a part of the organic resin film where the opening portion is formed is exposed with light using the photomask. The organic resin film is developed using a TMAH (tetramethyl ammonium hydroxide)-based developing solution, the substrate is dried, and then the baking is performed at 220° C. for approximately one hour. Accordingly, as shown in FIG. 12E, a bank 533 having the opening portion is formed, and the wirings 529 and 531 are partially exposed in the opening portion.

Since the positive photosensitive acrylic is colored to be light brown, it is decolorized in the case where the light is emitted from the light-emitting element to the substrate side. The decolorization process is performed by the same procedure as that performed to the organic resin film 522.

When the bank 533 is formed of the photosensitive organic resin, the cross sectional shape of the opening portion can be made into round. Therefore, the coverage of the electroluminescent layer and the cathode to be formed afterward can be improved, and the defect in which the light-emitting region decreases, which is called shrink, can be decreased.

Figure 13A:
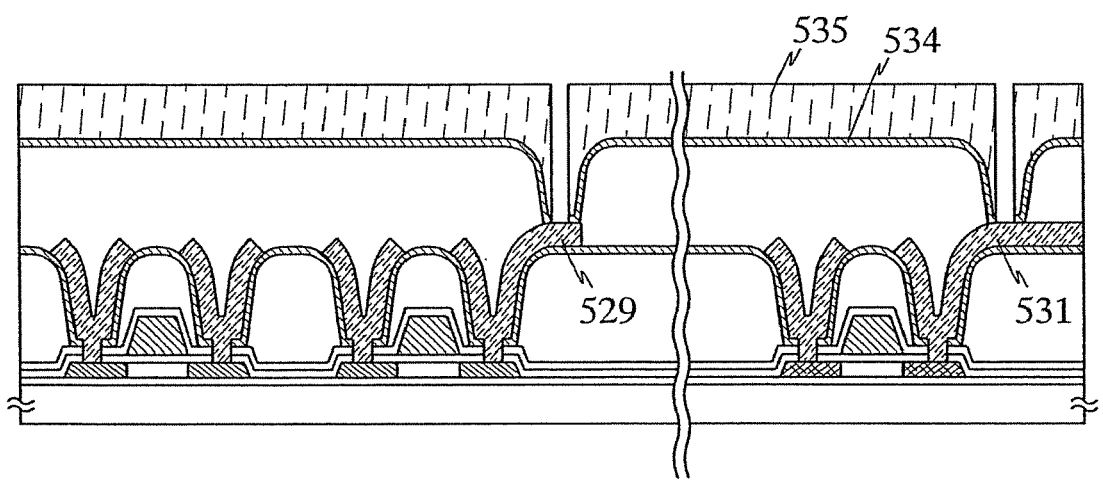
FIGS. 13A and 13B are drawings showing steps for manufacturing a semiconductor device using a laser irradiation method of the present invention.

Subsequently, as shown in FIG. 13A, a third inorganic insulating film 534 is formed of silicon nitride by the RF sputtering method so as to cover the bank 533 and the opening portion where the wirings 529 and 531 are partially exposed. The thickness of the third inorganic insulating film 534 is preferably from 10 to 200 nm. The material of the third inorganic insulating film 534 is not limited to silicon nitride, and an inorganic insulating material including nitride that can suppress the access of the moisture to the bank 533 may be used. For example, silicon oxynitride, aluminum nitride, or aluminum oxynitride can be used.

In the case of using the silicon oxynitride or the aluminum oxynitride, the proportion between oxygen and nitrogen in atomic % significantly affects its barrier property. The higher the proportion of nitrogen to oxygen is, the higher the barrier property is. Therefore, it is preferable that the oxynitride film includes more nitrogen than oxygen.

Next, a resist mask 535 is formed in the opening portion of the bank 533, and then a contact hole is formed to the third inorganic insulating film 534 by the dry etching method.

Due to the opening of the contact hole, the wirings 529 and 531 are partially exposed. The condition of the dry etching is determined appropriately in accordance with the material of the third inorganic insulating film 534. In this embodiment mode, since the third inorganic insulating film 534 is formed of silicon nitride, the third inorganic insulating film 534 is etched by using $CF_4$, $O_2$, and He as the etching gas.

It is important that the bank 533 is not exposed in the opening portion when being etched.

Figure 13B:
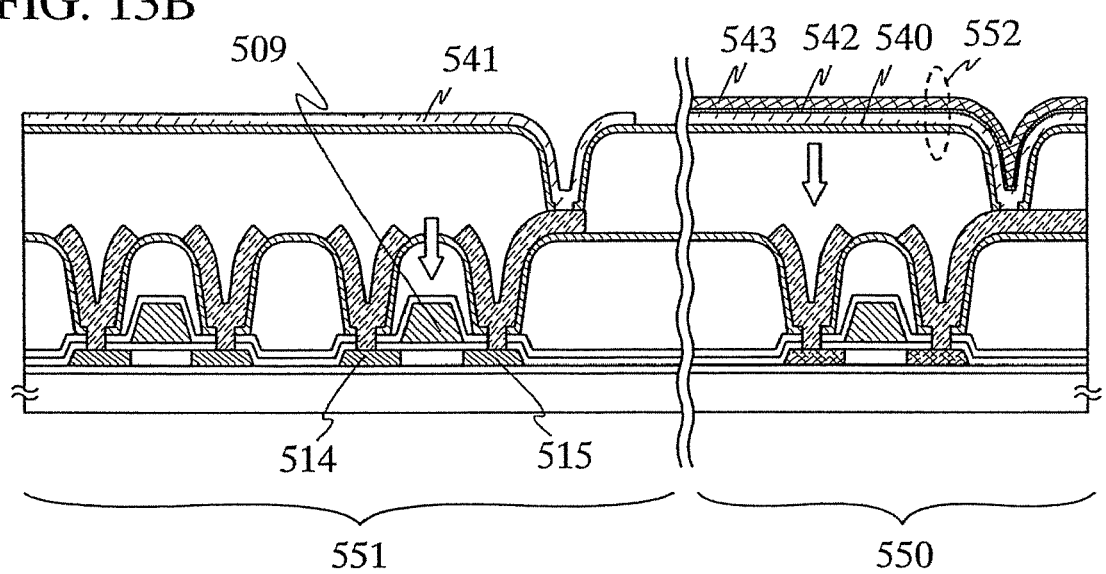

Next, a pixel electrode 540 in contact with the wiring 531 and a lead wiring 541 to obtain the current generated in the diode are formed by forming and patterning a 110-nm-thick transparent conductive film, for example, IFO film. A transparent conductive film in which zinc oxide (ZnO) is mixed into indium oxide by 2 to 20% may be used. The pixel electrode 540 will serve as the anode of the light-emitting element (FIG. 13B).

Next, an electroluminescent layer 542 is formed over the pixel electrode 540 by the evaporation method, and a cathode (MgAg electrode) 543 is formed further by the evaporation method. Here, it is desirable to remove the moisture completely by heat treatment to the pixel electrode 540 before forming the electroluminescent layer 542 and the cathode 543. Although the MgAg electrode is used as the cathode of the light-emitting element, other known conductive material having low work function, for example Ca, Al, CaF, MgAg, or AlLi, may be used.

When the cathode is formed of AlLi, the third inorganic insulating film 534 including nitrogen can prevent Li in AlLi from entering beyond the third inorganic insulating film 534 toward the substrate side.

A known material can be used as the electroluminescent layer 542. Although the electroluminescent layer includes two layers of a hole-transporting layer and a light-emitting layer in this embodiment mode, any one or a plurality of a hole-injecting layer, an electron-injecting layer, and an electron-transporting layer may be also provided. Various examples have been already reported concerning these combinations, and any configuration may be employed. For example, SAlq, CAlq, or the like may be used as the electron-transporting layer or the hole-blocking layer.

The thickness of the electroluminescent layer 542 may be set in the range of 10 to 400 nm (typically 60 to 150 nm), and the thickness of the cathode 543 may be set in the range of 80 to 200 nm (typically 100 to 150 nm).

Thus, a light-emitting device having a structure shown in FIG. 13B is completed. In FIG. 13B, a reference numeral 550 denotes a pixel portion and a reference numeral 551 denotes a driver circuit portion. The part of the pixel portion 550 where the pixel electrode 540, the electroluminescent layer 542, and the cathode 543 overlap corresponds to the light-emitting element.

It is noted that the structure of the light-emitting device and the specific manufacturing method described in this embodiment mode are just an example. The present invention is not limited to the description of this embodiment mode.

After the processes up to FIG. 13B are completed, it is preferable to package (enclose) with a protective film (a laminated film, an ultraviolet curable resin film, or the like) that is highly dense and that hardly degasses or with a light-transmitting cover member so that the light-emitting element is not exposed to the air. In this step, the reliability of light-emitting element can be enhanced when the inside of the cover member is filled with inert atmosphere or when a material having moisture-absorption property (such as barium oxide) is provided inside.

This embodiment mode 8 can be combined with any one of the embodiment modes 1 to 7.

Embodiment Mode 9

As electronic instruments using a semiconductor device manufactured by applying the laser irradiation method of the present invention, there are a video camera, a digital camera, a goggle type display (head mount display), a navigation system, a sound reproduction device (a car audio, an audio compo, and the like), a computer, a game machine, a mobile information terminal (a mobile computer, a mobile phone, a mobile game machine, an electronic book, and the like), an image reproduction device with a recording medium (specifically, a device for playing the recording medium such as a DVD (digital versatile disc) that is equipped with a display for displaying the image), and so on. FIGS. 16A to 16H show the specific examples of these electronic instruments.

Figure 16A:
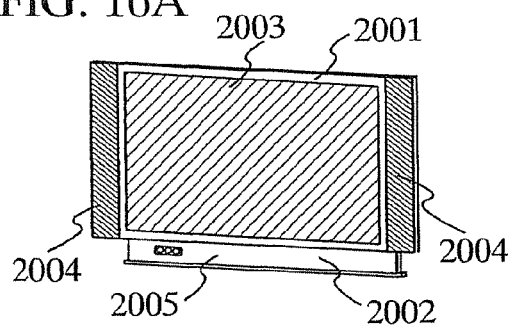
FIGS. 16A to 16H are drawings showing electronic instruments manufactured by applying a laser irradiation method of the present invention.

FIG. 16A shows a television receiver machine including a chassis 2001, a supporting stand 2002, a display portion 2003, a speaker portion 2004, a video input terminal 2005, and the like. The television receiver machine can be manufactured by applying the laser irradiation method described in any one of the above embodiment modes 1 to 7 to the process of the display portion 2003 and the like.

Figure 16B:
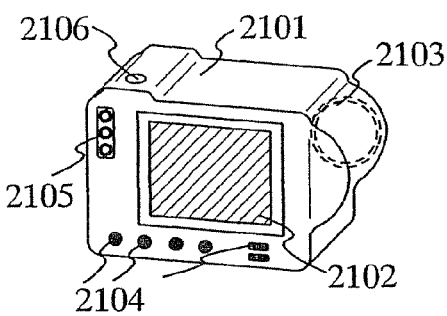

FIG. 16B shows a digital camera including a main body 2101, a display portion 2102, an image receiver portion 2103, an operation key 2104, an external connection port 2105, a shutter 2106, and the like. The digital camera can be manufactured by applying the laser irradiation method described in any one of the above embodiment modes 1 to 7 to the processes of the display portion 2102, the circuits, and the like.

Figure 16C:
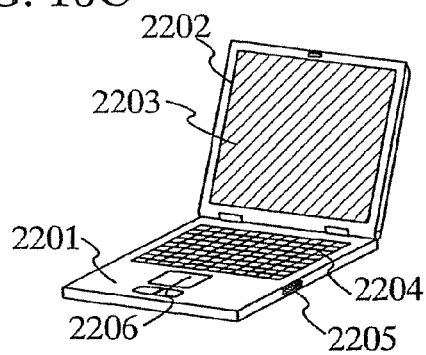

FIG. 16C shows a computer including a main body 2201, a chassis 2202, a display portion 2203, a keyboard 2204, an external connection port 2205, a pointing mouse 2206, and the like. The computer can be manufactured by applying the laser irradiation method described in any one of the above embodiment modes 1 to 7 to the processes of the display portion 2203, the circuits, and the like.

Figure 16D:
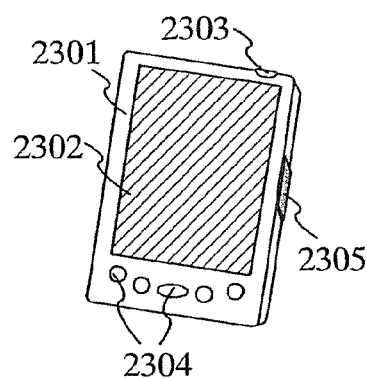

FIG. 16D shows a mobile computer including a main body 2301, a display portion 2302, a switch 2303, an operation key 2304, an infrared port 2305, and the like. The mobile computer can be manufactured by applying the laser irradiation method described in any one of the above embodiment modes 1 to 7 to the processes of the display portion 2302, the circuits, and the like.

Figure 16E:
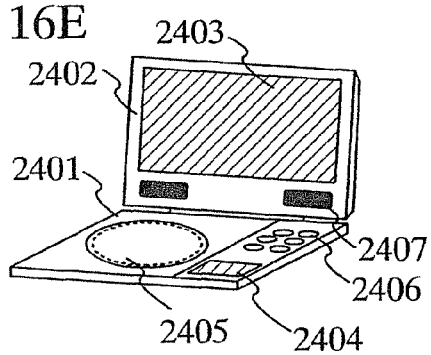

FIG. 16E shows a mobile image reproduction device with a recording medium equipped (such as a DVD reproduction device) including a main body 2401, a chassis 2402, a display portion A 2403, a display portion B 2404, a recording-medium reader portion 2405, an operation key 2406, a speaker portion 2407, and the like. The display portion A 2403 mainly displays image information, while the display portion B 2404 mainly displays text information. The image reproduction device can be manufactured by applying the laser irradiation method described in any one of the above embodiment modes 1 to 7 to the processes of the display portions A 2403 and B 2404, the circuits, and the like. The image reproduction device includes the game machine and the like.

Figure 16F:
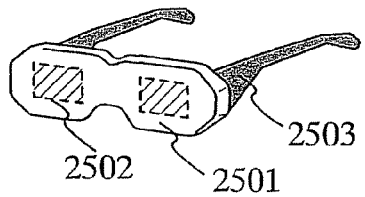

FIG. 16F shows a goggle type display (head mount display) including a main body 2501, a display portion 2502, and an arm portion 2503. The goggle type display can be manufactured by applying the laser irradiation method described in any one of the above embodiment modes 1 to 7 to the processes of the display portion 2502, the circuits, and the like.

Figure 16G:
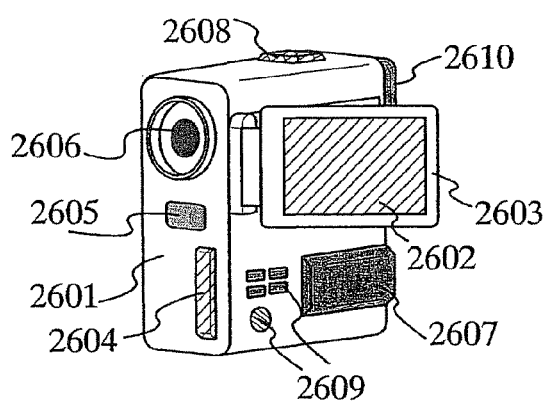

FIG. 16G shows a video camera including a main body 2601, a display portion 2602, a chassis 2603, an external connection port 2604, a remote controller receiving portion 2605, an image receiver portion 2606, a battery 2607, an audio input portion 2608, an operation key 2609, an eyepiece portion 2610, and the like. The video camera can be manufactured by applying the laser irradiation method described in any one of the above embodiment modes 1 to 7 to the processes of the display portion 2602, the circuits, and the like.

Figure 16H:
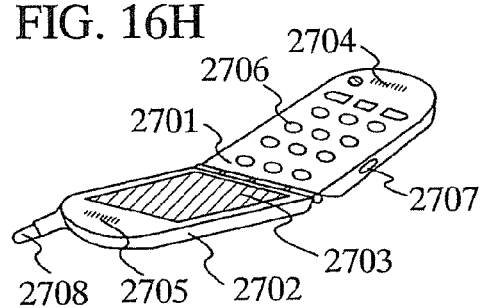

FIG. 16H shows a mobile phone including a main body 2701, a chassis 2702, a display portion 2703, an audio input portion 2704, an audio output portion 2705, an operation key 2706, an external connection port 2707, an antenna 2708, and the like. The mobile phone can be manufactured by applying the laser irradiation method described in any one of the above embodiment modes 1 to 7 to the processes of the display portion 2703, the circuits, and the like.

In addition to the above electronic instruments, a front type or rear type projector may be manufactured by applying the present invention.

As thus described, the present invention can be applied in a wide range, thereby being applicable to the electronic instruments of every field.

The present embodiment mode 9 can be freely combined with any one of the embodiment modes 1 to 8.

What is claimed is:

1. A laser irradiation method comprising:
   providing an irradiation object over a stage;
   irradiating the irradiation object with a linear beam spot through an optical system while moving the stage along a first direction; and
   moving the optical system along a second direction perpendicular to the first direction after moving the stage along the first direction,
   wherein a distance between the irradiation object and the optical system is controlled by an autofocusing mechanism before the stage is moved along the first direction.

2. The laser irradiation method according to claim 1, wherein the linear beam spot is emitted from a continuous wave laser oscillator.

3. The laser irradiation method according to claim 1, wherein the linear beam spot is emitted from a semiconductor laser oscillator.

4. The laser irradiation method according to claim 1, wherein the autofocusing mechanism comprises four-array photodetectors.

5. A laser irradiation method comprising:
   providing an irradiation object over a first stage;
   shaping a laser beam emitted from a laser oscillator into a linear beam spot by using an optical system provided with a second stage which is provided so as to bridge over the first stage; and
   irradiating the irradiation object with the linear beam spot while moving the first stage along a first direction,
   wherein a distance between the irradiation object and the optical system is controlled by an autofocusing mechanism before the first stage is moved along the first direction.

6. The laser irradiation method according to claim 5, wherein the laser oscillator is a continuous wave laser oscillator.

7. The laser irradiation method according to claim 5, wherein the laser oscillator is a semiconductor laser oscillator.

8. The laser irradiation method according to claim 5, wherein the autofocusing mechanism comprises four-array photodetectors.

9. A method for manufacturing a semiconductor device comprising:
   providing a substrate having a semiconductor film over a stage;
   irradiating the semiconductor film with a linear beam spot through an optical system while moving the stage along a first direction; and
   moving the optical system along a second direction perpendicular to the first direction after moving the stage along the first direction,
   wherein a distance between the semiconductor film and the optical system is controlled by an autofocusing mechanism before the stage is moved along the first direction.

10. The method for manufacturing the semiconductor device according to claim 9, wherein the linear beam spot is emitted from a continuous wave laser oscillator.

11. The method for manufacturing the semiconductor device according to claim 9, wherein the linear beam spot is emitted from a semiconductor laser oscillator.

12. The method for manufacturing the semiconductor device according to claim 9, wherein the autofocusing mechanism comprises four-array photodetectors.

13. The method for manufacturing the semiconductor device according to claim 9, wherein the semiconductor film comprises silicon.

14. A method for manufacturing a semiconductor device comprising:
   providing a substrate having a semiconductor film over a first stage;
   shaping a laser beam emitted from a laser oscillator into a linear beam spot by using an optical system provided with a second stage which is provided so as to bridge over the first stage; and
   irradiating the semiconductor film with the linear beam spot while moving the first stage along a first direction,
   wherein a distance between the semiconductor film and the optical system is controlled by an autofocusing mechanism before the first stage is moved along the first direction.

15. The method for manufacturing the semiconductor device according to claim 14,
wherein the laser oscillator is a continuous wave laser oscillator.

16. The method for manufacturing the semiconductor device according to claim 14,
wherein the laser oscillator is a semiconductor laser oscillator.

17. The method for manufacturing the semiconductor device according to claim 14,
wherein the autofocusing mechanism comprises four-array photodetectors.

18. The method for manufacturing the semiconductor device according to claim 14,
wherein the semiconductor film comprises silicon.

19. A method for manufacturing a semiconductor device comprising:
providing a semiconductor over a stage;
irradiating the semiconductor with a linear beam spot through an optical system while moving the stage along a first direction; and
moving the optical system along a second direction perpendicular to the first direction after moving the stage along the first direction,
wherein a distance between the semiconductor and the optical system is controlled by an autofocusing mechanism before the stage is moved along the first direction.

20. The method for manufacturing the semiconductor device according to claim 19,
wherein the linear beam spot is emitted from a continuous wave laser oscillator.

21. The method for manufacturing the semiconductor device according to claim 19,
wherein the linear beam spot is emitted from a semiconductor laser oscillator.

22. The method for manufacturing the semiconductor device according to claim 19,
wherein the autofocusing mechanism comprises four-array photodetectors.

23. The method for manufacturing the semiconductor device according to claim 19,
wherein the semiconductor comprises silicon.

24. A method for manufacturing a semiconductor device comprising:
providing a semiconductor over a first stage;
shaping a laser beam emitted from a laser oscillator into a linear beam spot by using an optical system provided with a second stage which is provided so as to bridge over the first stage; and
irradiating the semiconductor with the linear beam spot while moving the first stage along a first direction,
wherein a distance between the semiconductor and the optical system is controlled by an autofocusing mechanism before the first stage is moved along the first direction.

25. The method for manufacturing the semiconductor device according to claim 24,
wherein the laser oscillator is a continuous wave laser oscillator.

26. The method for manufacturing the semiconductor device according to claim 24,
wherein the laser oscillator is a semiconductor laser oscillator.

27. The method for manufacturing the semiconductor device according to claim 24,
wherein the autofocusing mechanism comprises four-array photodetectors.

28. The method for manufacturing the semiconductor device according to claim 24,
wherein the semiconductor comprises silicon.

29. A laser irradiation apparatus comprising:
a laser oscillator for emitting a laser beam;
an optical system including a lens for condensing the laser beam to form a linear beam spot on a surface of an irradiation object;
an X-axis stage for moving the irradiation object along a first direction;
an Y-axis stage for moving the optical system along a second direction perpendicular to the first direction; and
an autofocusing mechanism for controlling a distance between the irradiation object and the lens,
wherein the Y-axis stage is provided so as to bridge over the X-axis stage.

30. The laser irradiation apparatus according to claim 29,
wherein the laser oscillator is a continuous wave laser oscillator.

31. The laser irradiation apparatus according to claim 29, wherein the laser oscillator is a semiconductor laser oscillator.

32. The laser irradiation apparatus according to claim 29,
wherein the autofocusing mechanism comprises four-array photodetectors.

* * * * *